(12) United States Patent
Lee et al.

(10) Patent No.: US 10,079,210 B2
(45) Date of Patent: Sep. 18, 2018

(54) INTEGRATED CIRCUIT DEVICE AND METHOD OF FABRICATING THE SAME

(71) Applicant: Samsung Electronics Co., Ltd., Suwon-si, Gyeonggi-do (KR)

(72) Inventors: Do-sun Lee, Suwon-si (KR); Do-hyun Lee, Seoul (KR); Chul-sung Kim, Seongnam-si (KR); Sang-jin Hyun, Suwon-si (KR); Joon-gon Lee, Seoul (KR)

(73) Assignee: Samsung Electroics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/186,825

(22) Filed: Jun. 20, 2016

(65) Prior Publication Data

US 2017/0103948 A1    Apr. 13, 2017

(30) Foreign Application Priority Data

Oct. 12, 2015   (KR) .................. 10-2015-0142165

(51) Int. Cl.
| | |
|---|---|
| *H01L 21/02* | (2006.01) |
| *H01L 23/535* | (2006.01) |
| *H01L 27/088* | (2006.01) |
| *H01L 29/06* | (2006.01) |
| *H01L 29/417* | (2006.01) |
| *H01L 29/78* | (2006.01) |

(52) U.S. Cl.
CPC ........ *H01L 23/535* (2013.01); *H01L 27/0886* (2013.01); *H01L 29/0649* (2013.01); *H01L 29/41791* (2013.01); *H01L 29/785* (2013.01)

(58) Field of Classification Search
CPC .................. H01L 23/535; H01L 27/0886
See application file for complete search history.

(56) References Cited

U.S. PATENT DOCUMENTS

| | | | |
|---|---|---|---|
| 6,001,736 A | 12/1999 | Kondo et al. | |
| 6,008,124 A | 12/1999 | Sekiguchi et al. | |
| 6,025,269 A | 2/2000 | Sandhu | |

(Continued)

FOREIGN PATENT DOCUMENTS

| | | |
|---|---|---|
| JP | 07-297146 A | 11/1995 |
| JP | 08-298288 A | 11/1996 |
| KR | 10-0564119 B1 | 3/2006 |

*Primary Examiner* — Mark Tornow
(74) *Attorney, Agent, or Firm* — Harness, Dickey & Pierce, P.L.C.

(57) ABSTRACT

An integrated circuit device including a substrate having at least one fin-shaped active region, the at least one fin-shaped active region extending in a first direction, a gate line extending on the at least one fin-shaped active region in a second direction, the second direction intersecting with the first direction, a conductive region on a portion of the at least one fin-shaped active region at one side of the gate line, and a contact plug extending from the conductive region in a third direction, the third direction being perpendicular to a main plane of the substrate, may be provided. The contact plug may include a metal plug, a conductive barrier film on the conductive region, the conductive barrier film surrounding a sidewall and a bottom surface of the metal plug, the conductive barrier film including an N-rich metal nitride film, and a metal silicide film between the conductive region and the conductive barrier film.

20 Claims, 50 Drawing Sheets

(56) References Cited

U.S. PATENT DOCUMENTS

| | | |
|---|---|---|
| 6,927,162 B1 | 8/2005 | Yu et al. |
| 7,041,597 B2 | 5/2006 | Lim |
| 8,039,391 B1 | 10/2011 | Yin et al. |
| 8,304,343 B2 | 11/2012 | Choi et al. |
| 8,308,858 B2 | 11/2012 | Stewart et al. |
| 8,563,424 B2 | 10/2013 | Ganguli et al. |
| 8,586,479 B2 | 11/2013 | Fu et al. |
| 2009/0149020 A1* | 6/2009 | Hayashi .................. C23C 16/14 438/653 |
| 2010/0068881 A1 | 3/2010 | Kang et al. |
| 2013/0189839 A1* | 7/2013 | Guillorn ........... H01L 21/82381 438/675 |
| 2013/0260555 A1 | 10/2013 | Zope et al. |
| 2015/0072494 A1* | 3/2015 | Lin .................... H01L 29/66795 438/283 |
| 2015/0140814 A1 | 5/2015 | Thorum |
| 2015/0279840 A1* | 10/2015 | Huang .............. H01L 29/66545 257/384 |

\* cited by examiner

C - C'

C - C'

C - C'

C - C'

C - C'

C - C'

INTEGRATED CIRCUIT DEVICE AND METHOD OF FABRICATING THE SAME

CROSS-REFERENCE TO RELATED APPLICATION

This application claims the benefit of Korean Patent Application No. 10-2015-0142165, filed on Oct. 12, 2015, in the Korean Intellectual Property Office, the disclosure of which is incorporated herein in its entirety by reference.

BACKGROUND

The inventive concepts relate to integrated circuit devices and/or methods of fabricating the same, and more particularly, to integrated circuit devices including a contact plug connected to an active region of a substrate, and/or methods of fabricating the same.

Along with ultra-high integration of integrated circuit devices and reduction in lengths of gates of field effect transistors (FETs), in order to overcome limits of element characteristics of planar metal oxide semiconductor FETs (MOSFETs), efforts to develop an element including a FinFET having a 3-dimensional structured channel are being made. Further, along with reduction in feature sizes of FinFETs, a contact resistance between a source/drain region and a contact plug connected to the source/drain region acts as a main factor of parasitic resistances of integrated circuit devices. Therefore, there is a need to reduce or minimize a contact resistance between a source/drain region and a contact plugs of a FinFET.

SUMMARY

The inventive concepts provide integrated circuit devices having a structure capable of reducing minimizing a resistance of a contact plug.

The inventive concepts also provide methods of fabricating an integrated circuit device having a structure capable of reducing or minimizing a resistance of a contact plug.

According to an example embodiment, an integrated circuit device includes a substrate having at least one fin-shaped active region, the at least one fin-shaped active region extending in a first direction, a gate line extending on the at least one fin-shaped active region in a second direction, the second direction intersecting with the first direction, a conductive region on a portion of the at least one fin-shaped active region at one side of the gate line, and a contact plug extending from the conductive region in a third direction, the third direction being perpendicular to a main plane of the substrate. The contact plug includes a metal plug, a conductive barrier film on the conductive region, the conductive barrier film surrounding a sidewall and a bottom surface of the metal plug, the conductive barrier film including an N-rich metal nitride film, and a metal silicide film between the conductive region and the conductive barrier film.

In some example embodiments, the conductive barrier film may include a TiN film.

In some example embodiments, the sidewall and the bottom surface of the metal plug may be in physical contact with the conductive barrier film.

In some example embodiments, the integrated circuit device may further include a metal film extending from the metal silicide film in the third direction and surrounding an outer sidewall of the conductive barrier film.

In some example embodiments, the metal film and the metal silicide film may include a same metal.

In some example embodiments, the conductive barrier film may be in physical contact with the metal film and the metal silicide film.

In some example embodiments, the at least one fin-shaped active region may include a fin recess. A bottom of the fin recess may be at a level lower than a top surface of the at least one fin-shaped active region under the gate line. The conductive region may include a semiconductor layer epitaxially grown on the fin recess.

In some example embodiments, the integrated circuit device may further include an insulating spacer covering a sidewall of the gate line, the insulating spacer between the gate line and the contact plug.

In some example embodiments, the integrated circuit device may further include an insulating film between the insulating spacer and the contact plug. The insulating spacer may have a dielectric constant less than the insulating film.

In some example embodiments, the at least one fin-shaped active region may include a plurality of fin-shaped active regions extending parallel to each other, and the contact plug may extend on the plurality of fin-shaped active regions such that the contact plug intersects with the plurality of fin-shaped active regions.

According to an example embodiment, a method of fabricating an integrated circuit device may include forming an insulating film on a substrate having a conductive region, forming a contact hole which penetrates the insulating film and exposes the conductive region, forming a metal film in the contact hole such that the metal film contacts the conductive region, forming a conductive barrier film on the metal film to cover an inner wall of the contact hole, forming a metal silicide film by performing silicidation of at least a portion of the metal film using a silicidation atmosphere while the conductive barrier film is exposed to the silicidation atmosphere, forming a composition-changed conductive barrier film by treating the conductive barrier film in an atmosphere including at least one of nitrogen and hydrogen, while covering the metal silicide film with the conductive barrier film, and forming a metal plug on the composition-changed conductive barrier film to fill the contact hole.

In some example embodiments, the forming a conductive barrier film may include a metal nitride film having an atomic ratio of metal to nitrogen of 1:1, and the forming a composition-changed conductive barrier film may include increasing the amount of nitrogen in the metal nitride film.

In some example embodiments, the forming a conductive barrier film may include forming a metal nitride film having an atomic ratio of metal of nitrogen is 1:1, and the forming a composition-changed conductive barrier film may include reducing an amount of oxygen remaining in the conductive barrier film.

In some example embodiments, the forming a composition-changed conductive barrier film may include plasma-treating the conductive barrier film in a nitrogen-containing gas atmosphere, a hydrogen-containing gas atmosphere, or combinations thereof.

In some example embodiments, the forming a composition-changed conductive barrier film may include heat-treating the conductive barrier film in the atmosphere including nitrogen, hydrogen, or combinations thereof.

In some example embodiments, the forming a composition-changed conductive barrier film may include exposing the conductive barrier film to ultraviolet (UV) radiation.

In some example embodiments, the forming a metal plug may include forming a metal seed layer on the composition-changed conductive barrier film, forming a metal filling layer on the metal seed layer, the metal filling layer filling the contact hole, and reflowing the metal seed layer and the metal filling layer.

In some example embodiments, the forming a metal seed layer may include forming the metal seed layer to discontinuously extend on the composition-changed conductive barrier film such that a portion of the composition-changed conductive barrier film is exposed by the metal seed layer.

In some example embodiments, the method further includes post-treating a result product including the metal seed layer in a nitrogen-containing gas atmosphere, a hydrogen-containing gas atmosphere, or combinations thereof. The post-treating may be performed before the forming of the metal filling layer and after the forming of the metal seed layer.

In some example embodiments, the post-treating may include plasma-treating the result product.

In some example embodiments, the post-treating may include plasma-treating the result product by using a gas activated in a form of direct plasma.

In some example embodiments, the post-treating may include heat-treating the result product at a temperature of about 300° C. to about 1000° C.

In some example embodiments, the method may further include pre-treating an exposed surface of the conductive barrier film in a nitrogen-containing gas atmosphere, a hydrogen-containing gas atmosphere, or combinations thereof. The pre-treating may be performed after the forming a conductive barrier film and before the forming a metal silicide film.

In some example embodiments, the pre-treating may include plasma-treating the exposed surface of the conductive barrier film.

In some example embodiments, the pre-treating may include plasma-treating the exposed surface of the conductive barrier film by using a gas activated in a form of direct plasma.

In some example embodiments, the pre-treating may include heat-treating the exposed surface of the conductive barrier film at a temperature of about 300° C. to about 1000° C.

In some example embodiments, the forming a composition-changed conductive barrier film may include forming an N-rich metal nitride film.

According to an example embodiment, a method of fabricating an integrated circuit device includes forming a gate line and a plurality of source/drain regions on at least one fin-shaped active region, the plurality of source/drain regions being arranged at both sides of the gate line, forming an insulating film which covers the at least one fin-shaped active region, the gate line, and the plurality of source/drain regions, forming at least one contact hole to penetrate the insulating film and expose at least one source/drain region among the plurality of source/drain regions, forming a metal film in the contact hole such that the metal film contacts the at least one source/drain region, forming a conductive barrier film on the metal film to cover an inner wall of the contact hole, forming a metal silicide film by performing silicidation of at least a portion of the metal film using a silicidation atmosphere while the conductive barrier film is exposed to the silicidation atmosphere, forming a composition-changed conductive barrier film by treating the conductive barrier film in a first atmosphere including at least one of nitrogen and hydrogen, while covering the metal silicide film with the conductive barrier film, forming a metal seed layer to discontinuously extend on the composition-changed conductive barrier film such that the metal seed layer is exposed by the composition-changed conductive barrier film, post-treating the composition-changed conductive barrier film and the metal seed layer in a second atmosphere including at least one of nitrogen and hydrogen, and forming a metal filling layer on the post-treated metal seed layer to fill the contact hole.

In some example embodiment, the forming a composition-changed conductive barrier film may include exposing the conductive barrier film to any one of plasma, heat, and UV radiation.

In some example embodiment, the method may further include pre-treating an exposed surface of the conductive barrier film in an atmosphere comprising at least one of nitrogen and hydrogen. The pre-treating may be performed before the forming a metal silicide film and after the forming a conductive barrier film.

In some example embodiment, at least one of the pre-treating and the post-treating may include treating using any one of plasma, heat, or UV radiation.

In some example embodiment, when the at least one fin-shaped active region comprises a plurality of fin-shaped active areas extending parallel to each other, the plurality of source/drain regions may be on the plurality of fin-shaped active areas, the at least one contact hole may include a plurality of contact holes, and the contact holes expose the plurality of source/drain regions on the plurality of fin-shaped active areas, respectively, and the forming the metal film may include forming the metal film to contact the plurality of source/drain regions.

In some example embodiment, the method may further includes reflowing the metal seed layer and the metal filling layer by annealing the metal seed layer and the metal filling layer.

According to an example embodiment, a method of fabricating an integrated circuit device includes forming an insulating film on a substrate having a conductive region, forming a contact hole to penetrate the insulating film and expose the conductive region, forming a metal film in the contact hole such that the metal film contacts the conductive region, forming a conductive barrier film on the metal film to cover an inner wall of the contact hole, forming a metal silicide film by performing silicidation of at least a portion of the metal film using a silicidation atmosphere while the conductive barrier film is exposed to the silicidation atmosphere, forming a composition-changed conductive barrier film by treating the conductive barrier film in an atmosphere including at least one of nitrogen and hydrogen, while covering the metal silicide film with the conductive barrier film in a first chamber, the first chamber selected from among a plurality of process chambers of a cluster tool, and forming a metal plug on the composition-changed conductive barrier film using the cluster tool to fill the contact hole.

In some example embodiments, the first chamber may be a plasma treatment chamber, a heat treatment chamber, or a UV treatment chamber.

In some example embodiment, at least two consecutive processes from among the forming a metal film, the forming a conductive barrier film, the forming a metal silicide film, and the forming a composition-changed conductive barrier film may be consecutively performed using the plurality of process chambers, without vacuum break.

In some example embodiment, the forming a composition-changed conductive barrier film and the forming a metal plug may be consecutively performed using the plurality of process chambers, without vacuum break.

In some example embodiment, the forming a metal plug may include forming a metal seed layer on the composition-changed conductive barrier film, forming a metal filling layer on the metal seed layer, the metal filling layer filling the contact hole, and reflowing the metal seed layer and the metal filling layer. The forming a metal seed layer, the forming a metal filling layer, the reflowing a metal seed layer and the metal filling layer may be consecutively performed without vacuum break.

According to an example embodiment, an integrated circuit device includes a substrate having at least one active region, the at least one active region extending in a first direction, a gate line extending on the at least one fin-shaped active region in a second direction, the second direction intersecting with the first direction, a source/drain region the at least one active region at one side of the gate line, and a contact plug extending from the source/drain region in a third direction, the third direction being perpendicular to a main plane of the substrate. The contact plug includes a metal plug, a conductive barrier film on the source/drain region, the conductive barrier film surrounding a sidewall and a bottom surface of the metal plug, the conductive barrier film including an metal nitride film, a nitrogen content in the metal nitride film being greater than a nitrogen content according to a stoichiometric atomic ratio between metal and nitrogen, and a metal silicide film between the source/drain region and the conductive barrier film.

In some example embodiment, the conductive barrier film may include a TiN film.

In some example embodiment, the sidewall and the bottom surface of the metal plug may be in physical contact with the conductive barrier film.

In some example embodiment, the integrated circuit device may further include a metal film extending from the metal silicide film in the third direction and surrounding an outer sidewall of the conductive barrier film.

In some example embodiment, the metal film and the metal silicide film may include a same metal.

In some example embodiment, the conductive barrier film may be in physical contact with the metal film and the metal silicide film.

In some example embodiment, the integrated circuit device may further include an insulating spacer covering a sidewall of the gate line, the insulating spacer between the gate line and the contact plug.

In some example embodiment, the integrated circuit device may further include an insulating film between the insulating spacer and the contact plug. The insulating spacer may have a dielectric constant less than the insulating film.

In some example embodiment, the conductive region may include an epitaxially grown semiconductor layer on the at least one active region.

In some example embodiment, the at least one active region may include a plurality of active regions extending parallel to each other, and the contact plug may extend on the plurality of active regions such that the contact plug intersects with the plurality of active regions.

According to the inventive concepts, because the integrated circuit device exhibits an improved adhesion between the conductive barrier film and the metal plug thereon, which constitute the contact plug, the integrated circuit device can suppress generation of voids due to poor adhesion between the conductive barrier film and the metal plug, and/or can provide a contact structure having a relatively low resistance and relatively high reliability. Therefore, a contact resistance between the conductive region, such as a source/drain region, and the contact plug can be reduced.

BRIEF DESCRIPTION OF THE DRAWINGS

Example embodiments of the inventive concepts will be more clearly understood from the following detailed description taken in conjunction with the accompanying drawings in which:

FIG. 1A is a layout diagram of an integrated circuit device according to the example embodiment of the inventive concepts, FIG. 1B is a sectional view of the integrated circuit device taken along a line B-B' of FIG. 1A, and FIG. 1C is a sectional view of the integrated circuit device taken along a line C-C' of FIG. 1A;

FIG. 21A is a layout diagram of an integrated circuit device according to the example embodiment of the inventive concepts, FIG. 21B is a sectional view of the integrated circuit device taken along a line B-B' of FIG. 21A, and FIG. 21C is a sectional view of the integrated circuit device taken along a line C-C' of FIG. 21A;

DETAILED DESCRIPTION

Figure 1A:
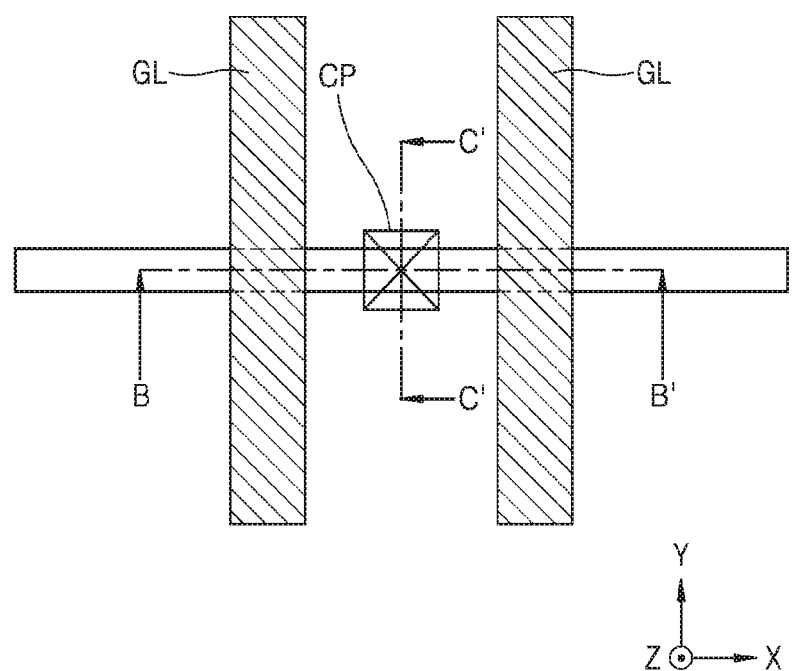
FIGS. 1A to 1C are diagrams for explaining an integrated circuit device according to an example embodiment of the inventive concepts.

Hereinafter, some example embodiments of the inventive concepts will be described in detail with reference to the accompanying drawings. Like components will be denoted by like reference numerals throughout the specification, and overlapping descriptions thereof will be omitted.

As used herein, the term "and/or" includes any and all combinations of one or more of the associated listed items. Expressions such as "at least one of," when preceding a list of elements, modify the entire list of elements and do not modify the individual elements of the list.

It should be understood that some example embodiments are provided for complete disclosure and thorough understanding of the inventive concepts by those of ordinary skill in the art, and the inventive concepts are not limited to the following example embodiments and may be embodied in different ways.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be also understood that although the terms such as "first", "second" and the like may be used herein to describe various members, regions, layers, portions, and/or components, these members, regions, layers, portions, and/or components should not be limited by these terms. These terms do not imply a specific order, a relative upper or lower location, or relative superiority or inferiority, and are used only to distinguish one member, region, portion, or component from another member, region, portion, or component. Thus, a first member, region, portion, or component, which will be described below, could be termed a second member, region, portion, or component without departing from the teachings of the inventive concepts. For example, a first component could be termed a second component without departing from the scope of the inventive concepts, and similarly, a second component could also be termed a first component.

Unless otherwise defined, all terms used herein, including technical and scientific terms, have the same meaning as generally understood by those of ordinary skill in the art. It will be understood that terms, such as those defined in generally used dictionaries, should be interpreted as having a meaning that is consistent with meanings understood in the context of the related art, and will not be interpreted in an idealized or overly formal sense unless expressly so defined herein.

When an example embodiment can be otherwise realized, specific processes may be performed in a different order from a described order. For example, two processes consecutively described may be substantially simultaneously performed, and may also be performed in an opposite order to a described order.

In the accompanying drawings, modifications of illustrated shapes can be anticipated, for example, depending upon fabricating techniques and/or tolerances. Thus, example embodiments of the inventive concepts are not to be construed as being limited to specific shapes of regions illustrated herein, and are to be construed as including, for example, variations of shapes caused in the process of fabrication. In addition, the term "substrate" used herein may refer to a substrate itself, or a stacked structure including a substrate and a certain layer, film, or the like on a surface of the substrate. Further, the term "surface of a substrate" may refer to an exposed surface of a substrate itself, or an outer surface of a certain layer, film, or the like on the substrate.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
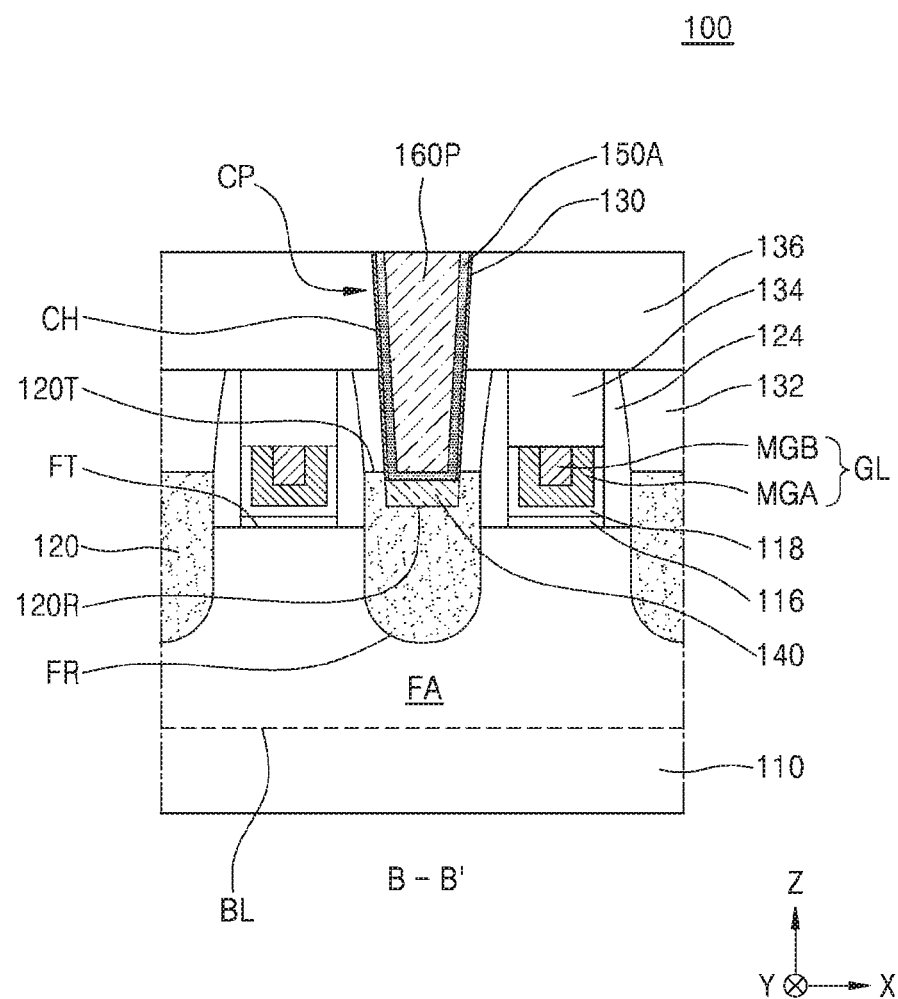
Figure 1C:
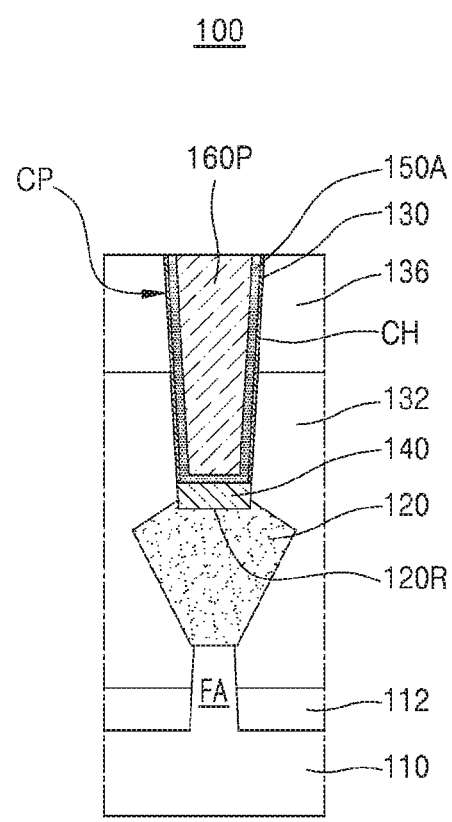

FIGS. 1A to 1C are diagrams for explaining an integrated circuit device according to an example embodiment of the inventive concepts, FIG. 1A is a layout diagram of an integrated circuit device 100, FIG. 1B is a sectional view of the integrated circuit device 100 taken along a line B-B' of FIG. 1A, and FIG. 1C is a sectional view of the integrated circuit device 100 taken along a line C-C' of FIG. 1A.

Referring to FIGS. 1A to 1C, the integrated circuit device 100 includes a substrate 110 having a fin-shaped active region (alternatively known as fin-type active region, fin type active region, or fin active region) FA extending in a first direction (X direction). In FIG. 1B, a level of a bottom surface of the fin-shaped active region FA is marked by a dotted line BL.

In some example embodiments, the substrate 110 may include a semiconductor such as Si or Ge, or a compound semiconductor such as SiGe, SiC, GaAs, InAs, or InP. In some example embodiments, the substrate 110 may include at least one of a Group III-V material and a Group IV material. The Group III-V material may be a binary, ternary, or quaternary compound including at least one Group III element and at least one Group V element. The Group III-V material may be a compound including at least one element of In, Ga, and Al as a Group III element, and at least one element of As, P, and Sb as a Group V element. For example, the Group III-V material may be selected from among InP, $In_zGa_{1-z}As$ ($0 \le z \le 1$), and $Al_zGa_{1-z}As$ ($0 \le z \le 1$). The binary compound may be, for example, any one of InP, GaAs, InAs, InSb, and GaSb. The ternary compound may be, for example, any one of InGaP, InGaAs, AlInAs, InGaSb, GaAsSb, and GaAsP. The Group IV material may be Si or Ge. However, the Group III-V material and the Group IV material, which can be used for the integrated circuit device according to the inventive concepts, are not limited to the examples set forth above. The Group III-V material and the Group IV material such as Ge may be used as a channel material allowing a low-power high-speed transistor to be made. A high-performance CMOS may be formed using a semiconductor substrate including a Group III-V material, for example, GaAs, which has a higher electron mobility than Si, and using a semiconductor substrate including a semiconductor material, for example, Ge, which has a higher hole mobility than Si. In some example embodiments, when an NMOS transistor is formed on the substrate 110, the substrate 110 may include any one of the example Group III-V materials set forth above. In some other example embodiments, when a PMOS transistor is formed on the substrate 110, at least a portion of the substrate 110 may include Ge. In another example, the substrate 110 may include a conductive region, for example, an impurity-doped well, or an impurity-doped structure.

In some example embodiments, the substrate 110 may have a desired (or alternatively, predetermined) MOS region. For example, the substrate 110 may have a PMOS region or an NMOS region.

A lower sidewall of the fin-shaped active region FA on the substrate 110 is covered with an element isolation film 112, and the fin-shaped active region FA protrudes in a fin shape upwards from the element isolation film 112 along a perpendicular direction (Z direction) to a main plane (X-Y plane) of the substrate 110.

A plurality of interface films 116, a plurality of gate insulating films 118, and a plurality of gate lines GL extend on the fin-shaped active region FA on the substrate 110 in a second direction (Y direction) intersecting with the first direction (X direction).

The plurality of gate insulating films 118 and the plurality of gate lines GL may extend while covering a top surface and both sidewalls of each fin-shaped active region FA, and a top surface of the element isolation film 112. A plurality of MOS transistors may be formed at points at which the fin-shaped active region FA intersects with the plurality of gate lines GL. Each of the plurality of MOS transistors may be a 3-dimensional structured MOS transistor in which a channel is formed on the top surface and both sidewalls of the fin-shaped active region FA.

Both sidewalls of each of the plurality of interface films 116, the plurality of gate insulating films 118, and the plurality of gate lines GL are covered with an insulating spacer 124.

The insulating spacer 124 may include an insulating material having a low dielectric constant of about 7 or less. As used herein, the term "low dielectric constant (low-K)" may refer to a dielectric constant that is less than 7. In some example embodiments, the insulating spacer 124 may include SiOCN, SiCN, SiBN, SiBCN, or combinations thereof.

Each of the plurality of interface films 116 may be obtained by oxidizing an exposed surface of the fin-shaped active region FA, and may serve to prevent an interface defect between the fin-shaped active region FA and the gate insulating films 118. In some example embodiments, the plurality of interface films 116 may include a low-K material having a dielectric constant of 9 or less, for example, silicon oxide, silicon oxynitride, or combinations thereof. In some other example embodiments, the plurality of interface films 116 may include silicate, or combinations of silicate and the example low-K materials set forth above.

The plurality of gate insulating films 118 may include a silicon oxide film, a high-k dielectric film, or combinations thereof. The high-k dielectric film may include a material having a greater dielectric constant than a silicon oxide film. For example, the gate insulating films 118 may have a dielectric constant of about 10 to about 25. The high-k dielectric film may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but the material included in the high-k dielectric film is not limited to the examples set forth above.

The plurality of gate lines GL extends, on the gate insulating films 118, in a direction intersecting with the fin-shaped active region FA while covering the top surface and both sidewalls of each fin-shaped active region FA.

The gate lines GL may include a first metal-containing layer MGA and a second metal-containing layer MGB. The first metal-containing layer MGA may serve to adjust a work function. The second metal-containing layer MGB may serve to fill a space formed on an upper side of the first metal-containing layer MGA. In some example embodiments, the first metal-containing layer MGA may include at least one of TiN, TaN, TiC, and TaC. In some example embodiments, the second metal-containing layer MGB may include W or Al.

In some other example embodiments, the gate lines GL may have a structure in which a metal nitride layer, a metal layer, a conductive capping layer, and a gap-fill metal film are sequentially stacked. Each of the metal nitride layer and the metal layer may include at least one metal selected from among Ti, W, Ru, Nb, Mo, Hf, Ni, Co, Pt, Yb, Tb, Dy, Er, and Pd. Each of the metal nitride layer and the metal layer may be formed by an ALD, metal organic ALD (MOALD), chemical vapor deposition (CVD), or metal organic CVD (MOCVD) process. The conductive capping layer may serve as a protective film preventing oxidation of a surface of the metal layer. Further, the conductive capping layer may serve as a wetting layer for facilitating deposition when another conductive layer is deposited on the metal layer. The conductive capping layer may include a metal nitride, for example, TiN, TaN, or combinations thereof, without being limited thereto. The gap-fill metal film may extend on the conductive capping layer. The gap-fill metal film may include a W film. The gap-fill metal film may be formed by an ALD, CVD, or physical vapor deposition (PVD) process. The gap-fill metal film may fill a recessed space, which is formed due to a stepped portion on a top surface of the conductive capping layer, without voids. In some example embodiments, the gate lines GL may include a stacked structure of TiAlC/TiN/W, a stacked structure of TiN/TaN/TiAlC/TiN/W, or a stacked structure of TiN/TaN/TiN/TiAlC/TiN/W. In the stacked structures set forth above, a TiAlC layer or a TiN layer may serve as a metal-containing layer for adjustment of a work function.

A source/drain region 120 is formed in the fin-shaped active region FA at one side of the gate line GL. The source/drain region 120 may include a semiconductor layer epitaxially grown on the fin-shaped active region FA. The source/drain region 120 may be an impurity-diffused region including an impurity-doped semiconductor layer. In some example embodiments, the source/drain region 120 may include impurity-doped Si, impurity-doped SiGe, or impurity-doped SiC.

In a portion of the fin-shaped active region FA, a bottom of a fin recess FR may be formed to be at a level lower than a top surface of the fin-shaped active region FA under the gate line GL. The source/drain region 120 may include a semiconductor layer epitaxially grown on the fin recess FR. In some example embodiments, the source/drain region 120 may have an embedded SiGe structure, which includes a plurality of epitaxially grown SiGe layers. The plurality of SiGe layers may have different Ge contents from each other. In some example embodiments, the source/drain region 120 may include an epitaxially grown Si layer, or an epitaxially grown SiC layer.

The source/drain region 120 may have a raised source/drain (RSD) structure having a top surface 120T that is at a higher level than a top surface FT of the fin-shaped active region FA. The top surface 120T of the source/drain region 120 may include a recessed portion 120R.

An inter-gate dielectric 132 is formed between the plurality of gate lines GL. The inter-gate dielectric 132 may be formed between two neighboring gate lines GL to cover the source/drain region 120. The inter-gate dielectric 132 may include a silicon oxide film, without being limited thereto.

In some example embodiments, the insulating spacer 124 may have a dielectric constant that is less than a dielectric constant of the inter-gate dielectric 132.

The plurality of gate lines GL is covered with a capping insulating film 134. The capping insulating film 134 prevents undesired foreign substances such as oxygen from penetrating into the plurality of gate lines GL, thereby serving to prevent an undesired change in threshold voltage in the gate lines GL, or a short circuit which may occur between the gate lines GL and a surrounding conductive region, for example, a contact plug CP. The capping insulating film 134 can contribute to maintaining a constant threshold voltage in the gate lines GL, and can prevent deterioration in electrical characteristics of a transistor including the gate lines GL. In some example embodiments, the capping insulating film 134 may include a film including silicon and nitrogen. For example, the capping insulating film 134 may include a silicon nitride ($Si_3N_4$) film, a silicon oxynitride (SiON) film, a carbon-containing silicon oxynitride (SiCON) film, or combinations thereof. In some example embodiments, the capping insulating film 134 may have a thickness of about 20 Å to about 50 Å.

An interlayer dielectric 136 is formed on the capping insulating film 134. The interlayer dielectric 136 may include a silicon oxide film, without being limited thereto.

In some example embodiments, at least one of the inter-gate dielectric 132 and the interlayer dielectric 136 may include a tetraethyl orthosilicate (TEOS) film. In some other example embodiments, at least one of the inter-gate dielectric 132 and the interlayer dielectric 136 may include an ultra-low-K (ULK) film having an ultra-low dielectric constant K of about 2.2 to about 2.4, for example, any one film selected from among a SiOC film and a SiCOH film.

On the source/drain region 120, the contact plug CP extends from an inside of a recessed portion 120R in a third direction (Z direction) perpendicular to the main plane (X-Y plane) of the substrate 110. The contact plug may penetrate the interlayer dielectric 136 and the inter-gate dielectric 132 to be electrically connected to the source/drain region 120.

The contact plug CP may be surrounded by the inter-gate dielectric 132 and the interlayer dielectric 136, thereby being insulated from other surrounding conductive layers. The contact plug CP includes a metal plug 160P extending in the perpendicular direction (Z direction) to the main plane of the substrate 110 in a contact hole CH penetrating the interlayer dielectric 136 and the inter-gate dielectric 132, and a conductive barrier film 150A surrounding a sidewall and a bottom surface of the metal plug 160P on the source/drain region 120.

In some example embodiments, the conductive barrier film 150A may include an N-rich metal nitride film. As used herein, the term "N-rich metal nitride film" refers to a metal nitride film having a nitrogen content that is greater than a nitrogen content according to a stoichiometric atomic ratio between a metal and nitrogen. In some example embodiments, the conductive barrier film 150A may include N-rich TiN, N-rich TaN, N-rich AlN, N-rich WN, or combinations thereof.

A metal silicide film 140 is interposed between the source/drain region 120 and the conductive barrier film 150A.

The metal silicide film 140 may include titanium silicide, cobalt silicide, nickel silicide, tantalum silicide, hafnium silicide, or lanthanum silicide, without being limited thereto.

A metal film 130 surrounding an outer sidewall of the conductive barrier film 150A may be formed in the contact hole CH. The metal film 130 may extend from the metal silicide film 140 in the perpendicular direction (Z direction) to the main plane of the substrate 110. The metal film 130 may be formed to surround the outer sidewall of the conductive barrier film 150A while interposed between the conductive barrier film 150A and the inter-gate dielectric 132 and between the conductive barrier film 150A and the interlayer dielectric 136.

The metal film 130 may be formed to cover a surface of the recessed portion 120R of the source/drain region 120, which is exposed in the contact hole CH, and an inner sidewall of the contact hole CH. In some example embodiments, the metal film 130 may include Ti, W, Cu, Ta, La, Ru, Nb, Mo, Hf, Ni, Co, Pt, Yb, Tb, Dy, Er, Pd, or combinations thereof. For example, the metal silicide film 140 may include titanium silicide, and the metal film 130 may include titanium.

The metal silicide film 140 and the metal film 130 may constitute the contact plug CP, which fills an inside of the contact hole CH, in conjunction with the metal plug 160P and the conductive barrier film 150A.

Because the integrated circuit device 100 shown in FIGS. 1A to 1C includes the contact plug CP exhibiting improved adhesion between the conductive barrier film 150A and the metal plug 160P thereon, the integrated circuit device 100 can suppress generation of voids due to poor adhesion therebetween. Thus, the integrated circuit device 100 can provide a contact structure having a relatively low resistance and relatively high reliability, and/or a contact resistance between the source/drain region 120 and the contact plug CP can be reduced.

Figure 2A:
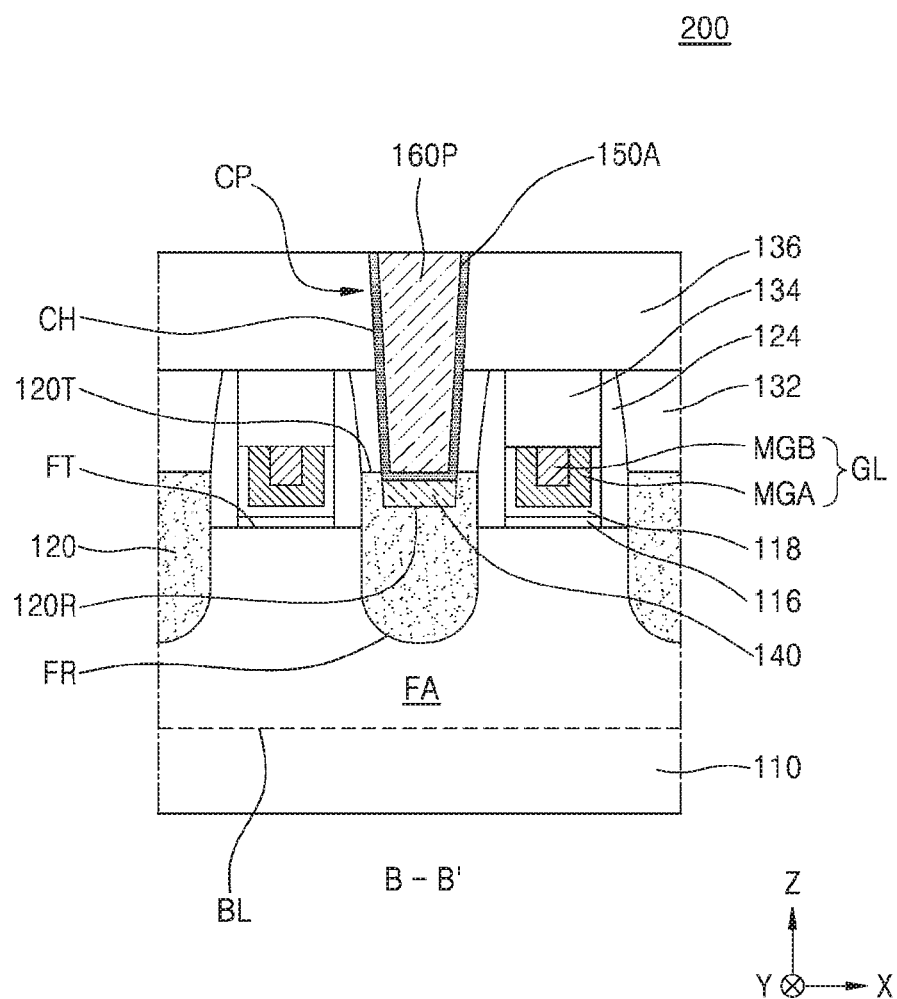
FIGS. 2A and 2B are diagrams for explaining an integrated circuit device according to an example embodiment of the inventive concepts.
Figure 2B:
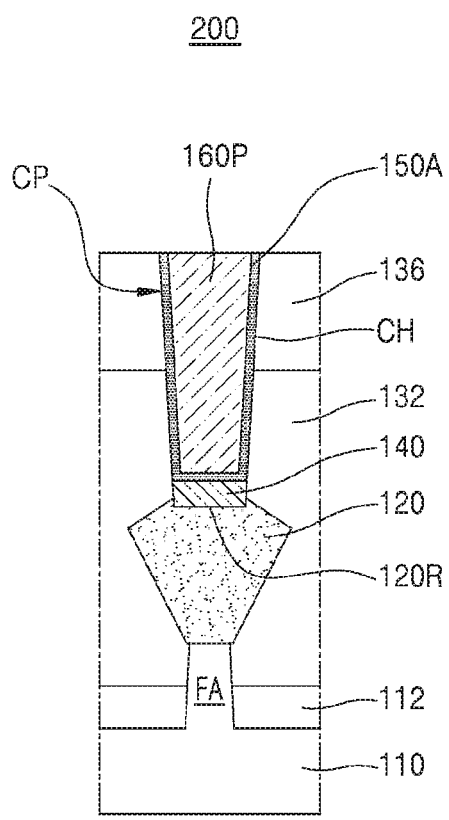

FIGS. 2A and 2B are diagrams for explaining an integrated circuit device according to an example embodiment of the inventive concepts, FIG. 2A is a sectional view corresponding to the cross-section taken along the line B-B' of FIG. 1A, and FIG. 2B is a sectional view corresponding to the cross-section taken along the line C-C' of FIG. 1A. In FIGS. 2A and 2B, the same reference numerals as in FIGS. 1A to 1C denote the same members, and details thereof will be omitted hereinafter.

Referring to FIGS. 2A and 2B, an integrated circuit device 200 has the same configuration as the integrated circuit device 100 shown in FIGS. 1A to 1C except that the metal film 130 is absent.

In the integrated circuit device 200, the conductive barrier film 150A may directly contact the inter-gate dielectric 132, the interlayer dielectric 136, and the metal silicide film 140.

Figure 3A:
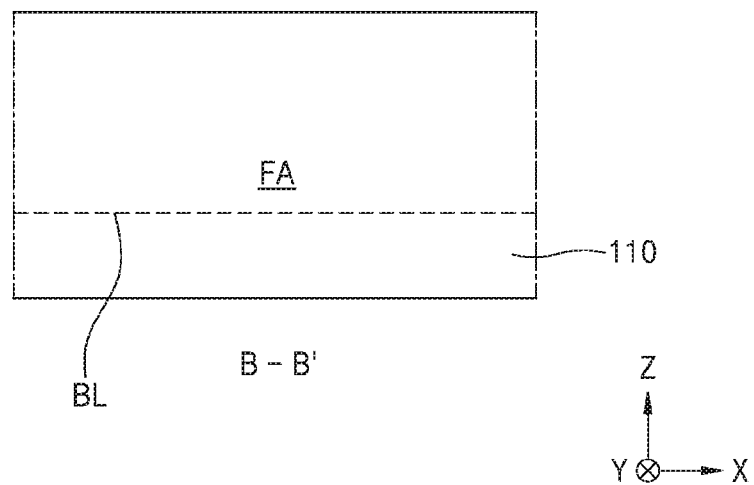
FIGS. 3A to 17B are diagrams shown in accordance with a process order in order to explain a method of fabricating an integrated circuit device according to an example embodiment of the inventive concepts.

FIGS. 3A to 17B are diagrams shown in accordance with a process order in order to explain a method of fabricating an integrated circuit device according to an example embodiments of the inventive concepts. FIGS. 3A, 4A, . . . , and 17A are sectional views showing a portion corresponding to the cross-section taken along the line B-B' of FIG. 1A in accordance with the process order, and FIGS. 3B, 4B, . . . , and 17B are sectional views showing a portion corresponding to the cross-section taken along the line C-C' of FIG. 1A in accordance with the process order.

An example method of fabricating an integrated circuit device according to example embodiments of the inventive concepts will be described in detail with reference to FIGS. 3A to 17B. In FIGS. 3A to 17B, the same reference numerals as in FIGS. 1A to 1C denote the same members, and details thereof will be omitted hereinafter.

Figure 3B:
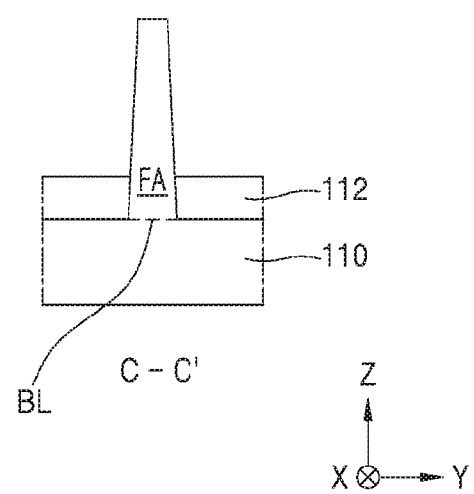
Figure 4A:
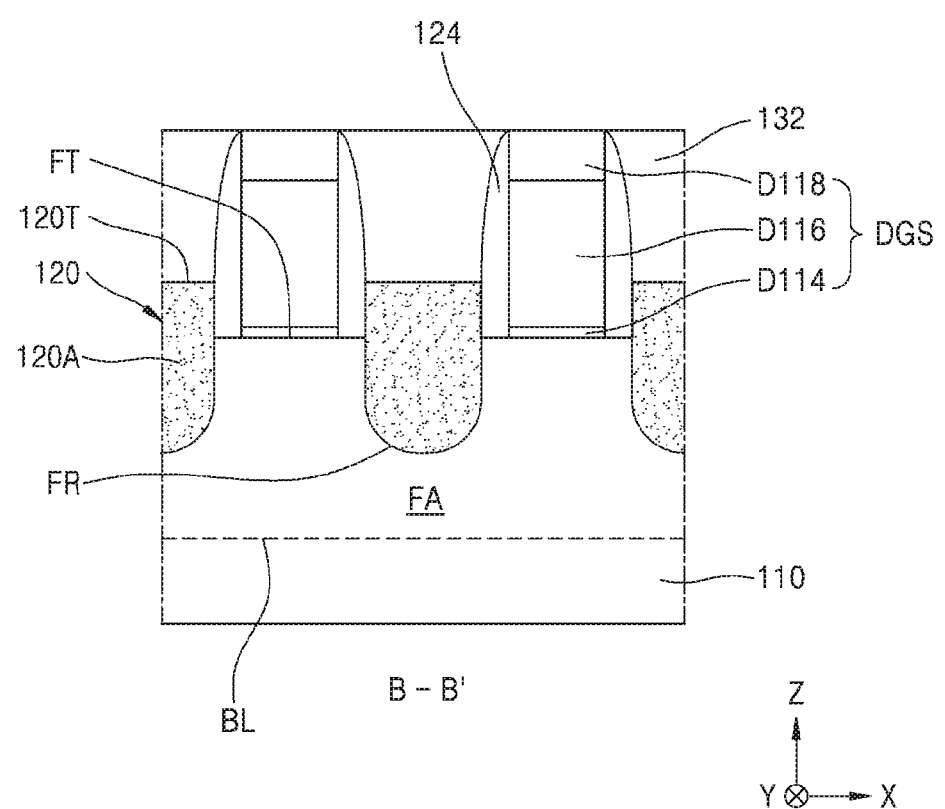

First, referring to FIGS. 3A and 3B, a fin-shaped active region FA, which protrudes upwards from a main plane (X-Y plane) of a substrate 110 and extends in one direction (for example, an X direction), may be formed by etching some regions of the substrate 110.

In some example embodiments, a portion of the substrate 110 shown in FIGS. 3A and 3B may be a region for forming any one of a PMOS transistor and an NMOS transistor. The fin-shaped active region FA may include P-type or N-type impurity-diffused regions (not shown) according to a channel type of a MOS transistor intended to be formed in the fin-shaped active region FA.

Next, an element isolation film 112 covering a lower sidewall of the fin-shaped active region FA may be formed on the substrate 110. The fin-shaped active region FA may protrude upwards from a top surface of the element isolation film 112 to be exposed.

Figure 4B:
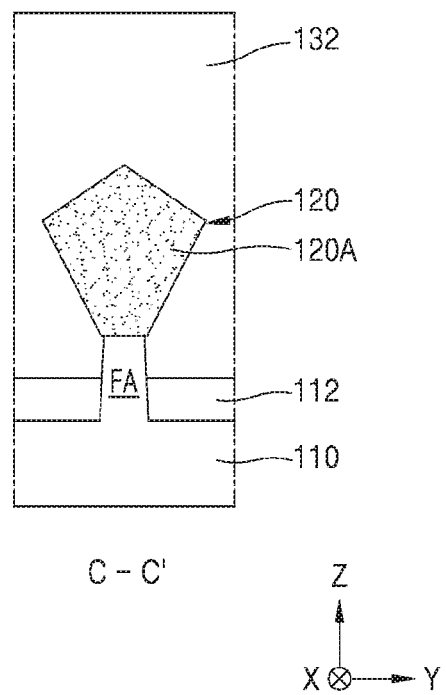

Referring to FIGS. 4A and 4B, a plurality of dummy gate structures DGS, which extends on the fin-shaped active region FA while intersecting with the fin-shaped active region FA, may be formed.

Each of the plurality of dummy gate structures DGS may include a dummy gate insulating film D114, a dummy gate line D116, and a dummy gate capping layer D118, which are sequentially stacked on the fin-shaped active region FA. In some example embodiments, the dummy gate insulating film D114 may include silicon oxide. The dummy gate line D116 may include polysilicon. The dummy gate capping layer D118 may include at least one of silicon oxide, silicon nitride, and silicon oxynitride.

Next, an insulating spacer 124 may be formed on both sidewalls of the dummy gate structure DGS. In some example embodiments, the insulating spacer 124 may be formed by a CVD process or an ALD process.

Next, a fin recess FR is formed by removing a portion of the fin-shaped active region FA exposed at both sides of the dummy gate structure DGS, and a source/drain region 120 including a crystalline semiconductor region by forming a semiconductor layer on the fin recess FR through an epitaxial growth process. In some example embodiments, the source/drain region 120 may include an epitaxially grown Si layer, an epitaxially grown SiC layer, an embedded SiGe structure including a plurality of epitaxially grown SiGe layers, or the like. The source/drain region 120 may be a conductive region including an impurity-doped semiconductor layer. In some example embodiments, the source/drain region 120 may include an impurity-doped Si, an impurity-doped SiGe, or an impurity-doped SiC.

The source/drain region 120 may have a top surface 120T at a higher level than a top surface FT of the fin-shaped active region FA.

In some example embodiments, sectional shapes of the source/drain region 120 are not limited to the examples shown in FIGS. 4A and 4B. For example, a sectional shape of the source/drain region 120, which is cut along a Y-Z plane, may be a polygonal shape (e.g., a quadrangle, a pentagon, or a hexagon), a circular shape, or an elliptical shape.

An inter-gate dielectric 132, which covers the source/drain region 120, the plurality of dummy gate structures DGS, and the insulating spacer 124, may be formed.

In an example for forming the inter-gate dielectric 132, a dielectric having a sufficient thickness to cover the source/drain region 120, the plurality of dummy gate structures DGS, and the insulating spacer 124 may be formed. Next, the inter-gate dielectric 132 having a planarized top surface may be formed by planarizing a result product, such that the plurality of dummy gate structures DGS can be exposed.

In some example embodiments, the inter-gate dielectric 132 may include an oxide film, for example, a tetraethyl orthosilicate (TEOS) film. In some other example embodiments, the inter-gate dielectric 132 may include an ultra-low-K (ULK) film, for example, a SiOC film or a SiCOH film, which has an ultra-low dielectric constant K of about 2.2 to about 2.4.

Figure 5A:
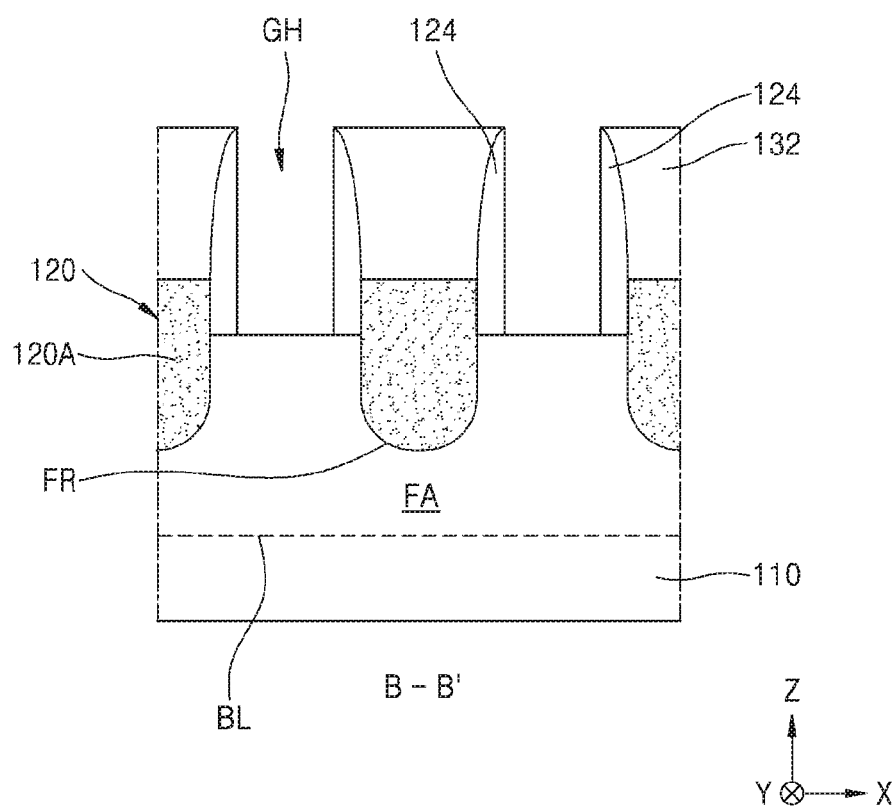
Figure 5B:
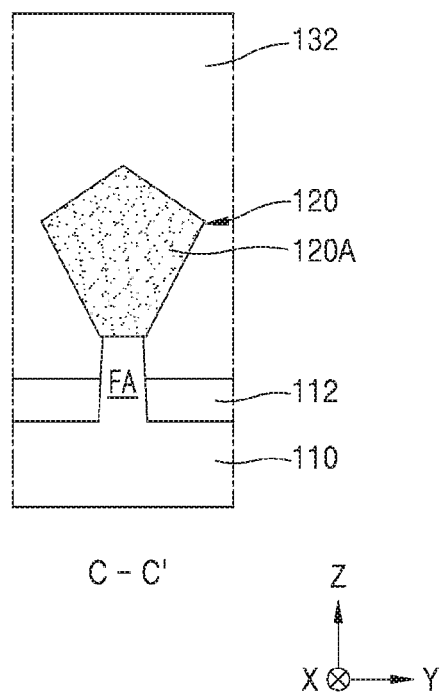

Referring to FIGS. 5A and 5B, a plurality of gate spaces GH may be formed by removing the plurality of dummy gate structures DGS exposed through the inter-gate dielectric 132.

The insulating spacer 124 and the fin-shaped active region FA may be exposed through the plurality of gate spaces GH.

Figure 6A:
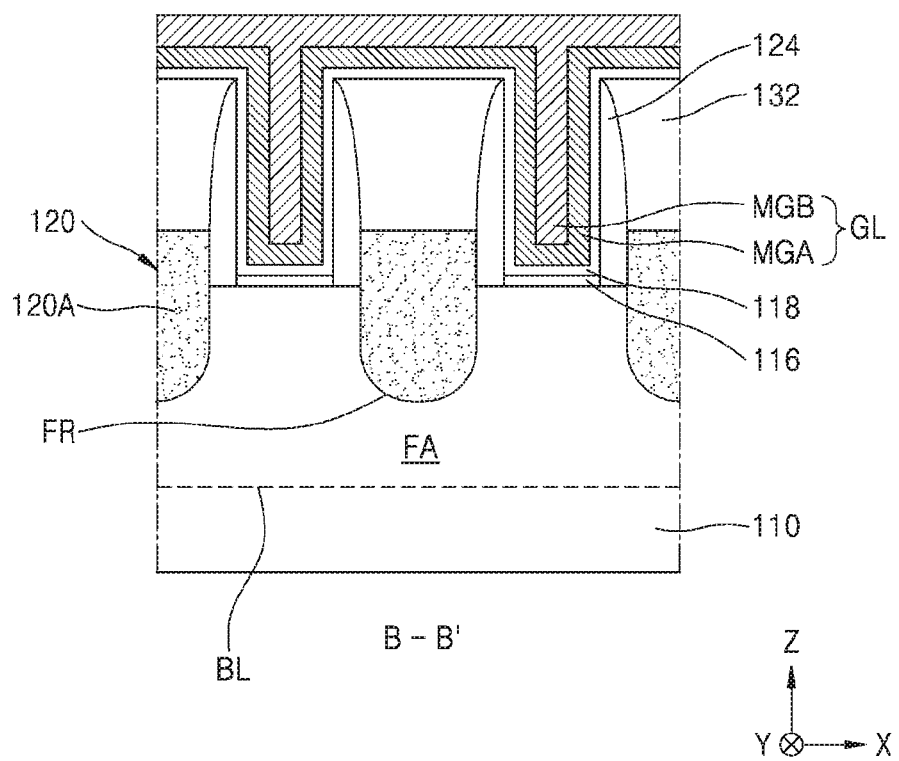
Figure 6B:
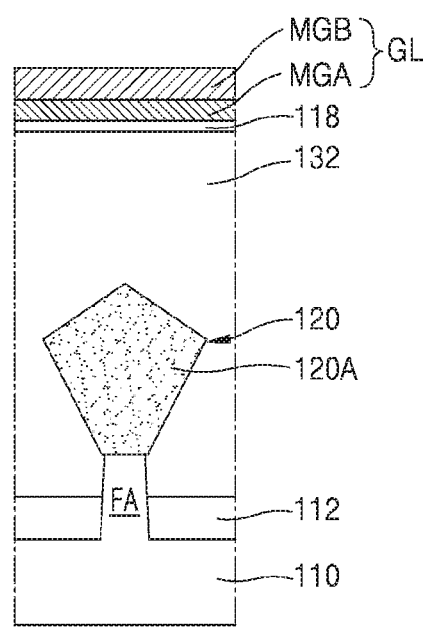

Referring to FIGS. 6A and 6B, a plurality of interface films 116, a gate insulating film 118, and a gate line GL may be sequentially formed in the plurality of gate spaces GH (see FIG. 5A).

A process of forming the plurality of interface films 116 may include a process of oxidizing a portion of the fin-shaped active region FA exposed in the plurality of gate spaces GH (see FIG. 5A). The plurality of interface films 116 may serve to inhibit or prevent an interface defect between a plurality of gate insulating films 118 on the plurality of interface films 116 and the underlying fin-shaped active region FA 116. In some example embodiments, the plurality of interface films 116 may include a silicon oxide film, a silicon oxynitride film, a silicate film, or combinations thereof.

The gate insulating film 118 and the gate line GL may be formed to cover a top surface of the inter-gate dielectric 132 while filling insides of the plurality of gate spaces GH (see FIG. 5A).

The gate insulating film 118 may include a silicon oxide film, a high-K dielectric film, or combinations thereof. The high-K dielectric film may include a material having a greater dielectric constant than a silicon oxide film. For example, the gate insulating film 118 may have a dielectric constant of about 10 to about 25. The gate insulating film 118 may be formed by an ALD, CVD, or PVD process.

The gate line GL may include a first metal-containing layer MGA and a second metal-containing layer MGB.

Figure 7A:
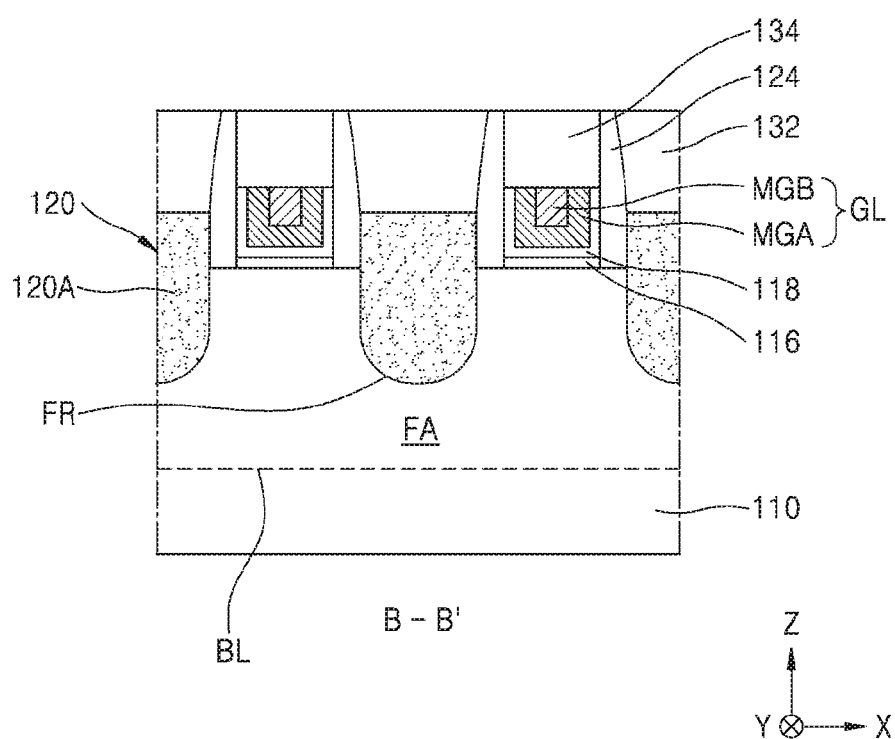
Figure 7B:
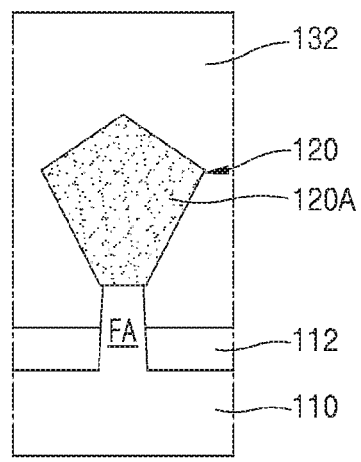

Referring to FIGS. 7A and 7B, undesirable portions may be removed by performing a planarization process for a result product of FIGS. 6A and 6B, and the gate line GL and the gate insulating film 118 may be respectively separated into a plurality of gate lines GL and a plurality of gate insulating films 118, which remain in the plurality of gate spaces GH (see FIG. 5A). Next, upper portions of the plurality of gate spaces GH (see FIG. 5A) may be emptied by further removing portions of the plurality of gate lines GL and the plurality of gate insulating films 118. A capping insulating film 134 filling a plurality of emptied gate spaces GH may be formed.

After the capping insulating film 134 is formed, the insulating spacer 124 and the inter-gate dielectric 132 may be consumed from respective top surfaces thereof to a certain thickness, whereby thicknesses of the insulating spacer 124 and the inter-gate dielectric 132 may be reduced, and top surfaces of a plurality of insulating spacers 124 and a top surface of the inter-gate dielectric 132 may be exposed around a top surface of the capping insulating film 134.

Figure 8A:
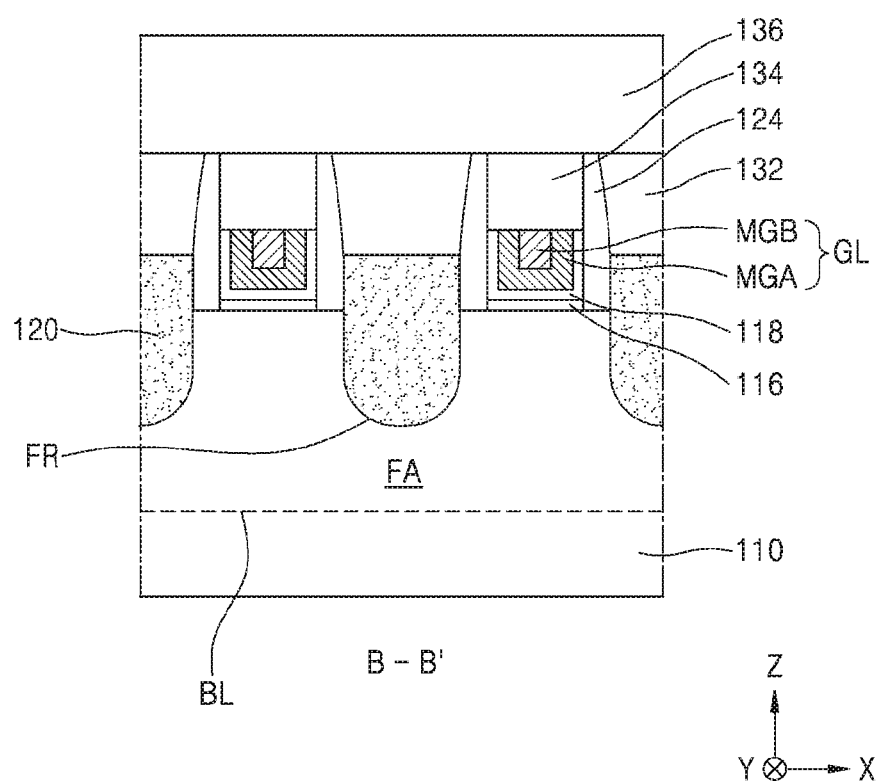
Figure 8B:
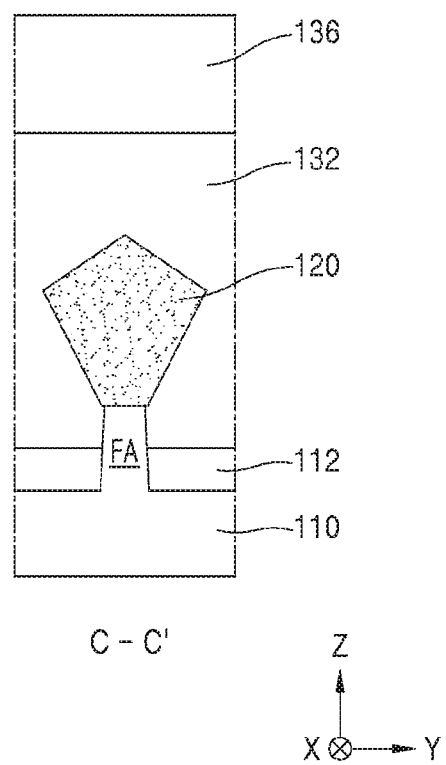

Referring to FIGS. 8A and 8B, an interlayer dielectric 136 may be formed on the plurality of gate lines GL and the inter-gate dielectric 132. The interlayer dielectric 136 may have a planarized top surface.

In some example embodiments, the interlayer dielectric 136 may include an oxide film, for example, a TEOS film. In some other example embodiments, the interlayer dielectric 136 may include a ULK film, for example, a SiOC film or a SiCOH film, which has an ultra-low dielectric constant of about 2.2 to about 2.4.

Figure 9A:
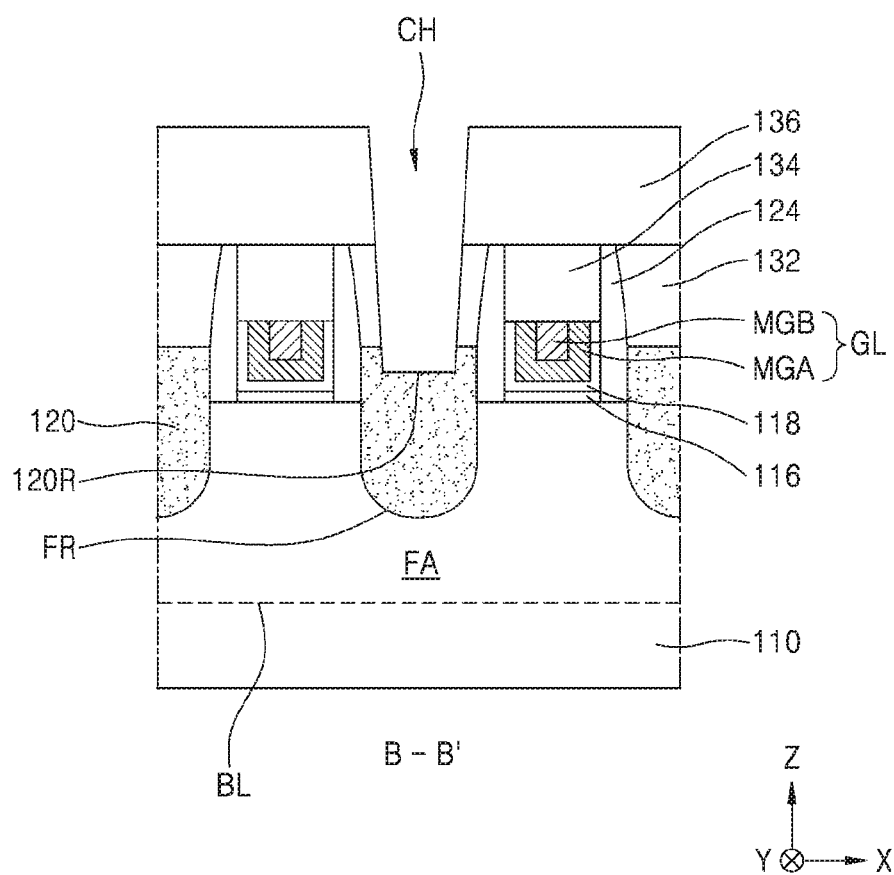
Figure 9B:
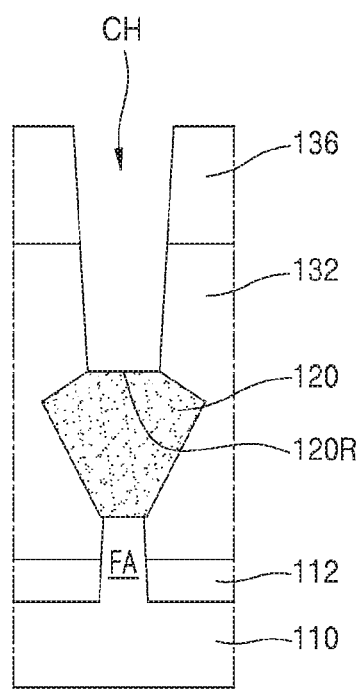
Figure 9B:
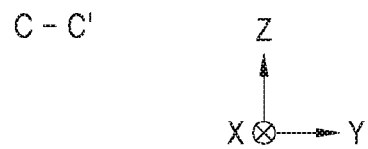

Referring to FIGS. 9A and 9B, a mask pattern (not shown) may be formed on the interlayer dielectric 136, followed by sequentially etching the interlayer dielectric 136 and the inter-gate dielectric 132 using the mask pattern as an etch mask, thereby forming a contact hole CH penetrating the interlayer dielectric 136 and the inter-gate dielectric 132.

The source/drain region 120 may be exposed through the contact hole CH.

A recessed portion 120R may be formed on the top surface 120T of the source/drain region 120 by removing a portion of the source/drain region 120 exposed through the contact hole CH while the contact hole CH is formed. Although an example in which a bottom surface of the recessed portion 120R is at a higher level than the top surface of the fin-shaped active region FA under the gate line GL is shown in FIGS. 9A and 9B, the inventive concepts are not limited to the example. For example, the bottom surface of the recessed portion 120R may be at the same level as the top surface of the fin-shaped active region FA under the gate line GL, or may be at a lower level than the top surface of the fin-shaped active region FA under the gate line GL.

The contact hole CH having the bottom surface of the recessed portion 120R may have an aspect ratio of at least 2. For example, the contact hole CH may have an aspect ratio of about 4 or more.

After the contact hole CH is formed, a cleaning process for removing undesired materials (e.g., a native oxide film) from exposed surfaces in the contact hole CH may be performed. The cleaning process may be performed in wet and/or dry manners.

Figure 10A:
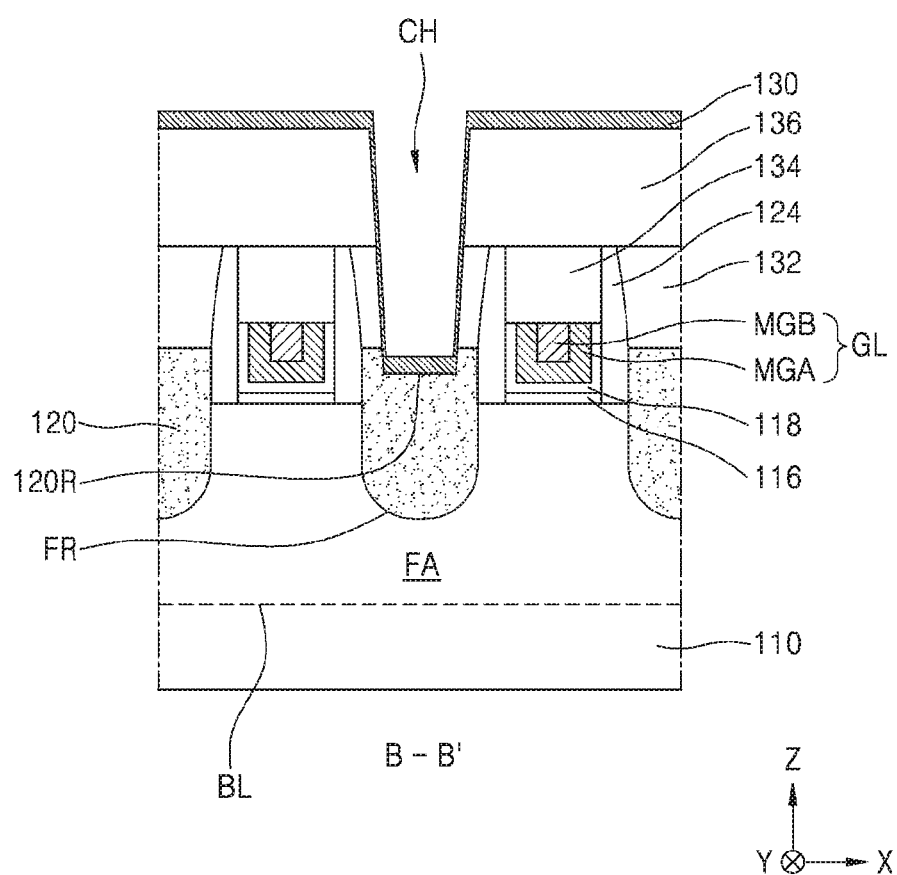
Figure 10B:
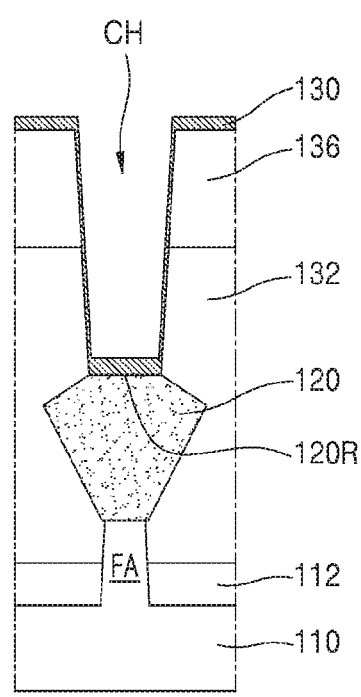

Referring to FIGS. 10A and 10B, a metal film 130 contacting the source/drain region 120 may be formed in the contact hole CH.

The metal film 130 may be formed to cover a surface of the recessed region 120R, which is exposed in the contact hole CH, and an inner sidewall of the contact hole CH.

In some example embodiments, the metal film 130 may be formed using a PVD process. As shown in FIGS. 10A and 10B, portions of the metal film 130, which horizontally extends to cover the bottom surface of the recessed portion 120R and a top surface of the interlayer dielectric 136, may have a greater thickness than portions of the metal film 130, which covers the sidewall of the contact hole CH. However, shapes and thickness distribution of the metal film 130 are not limited to an example shown in FIGS. 10A and 10B.

The metal film 130 may be formed at room temperature. In some example embodiments, the metal film 130 may be formed in an atmosphere of a temperature of about 15° C. to about 40° C. As such, a process of forming the metal film 130 may be performed at a relatively low temperature, whereby a thermal budget can be minimized upon performing the process of forming the metal film 130, and as a result, an increase in contact resistance in a contact structure obtained from the metal film 130 can be suppressed.

Figure 11A:
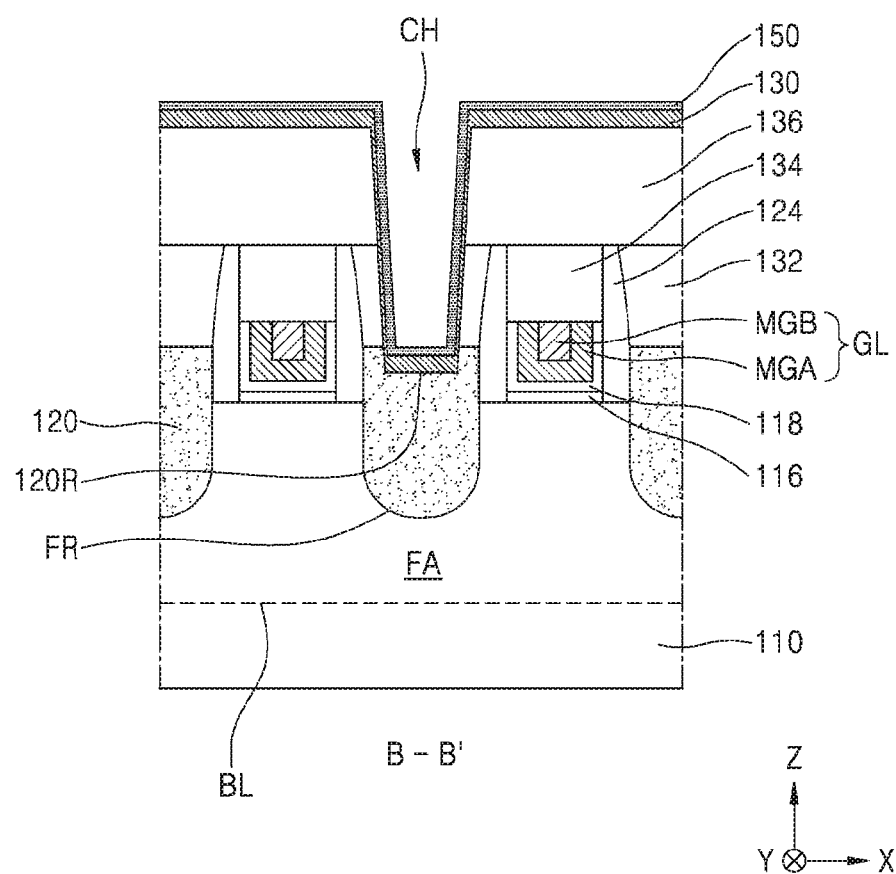
Figure 11B:
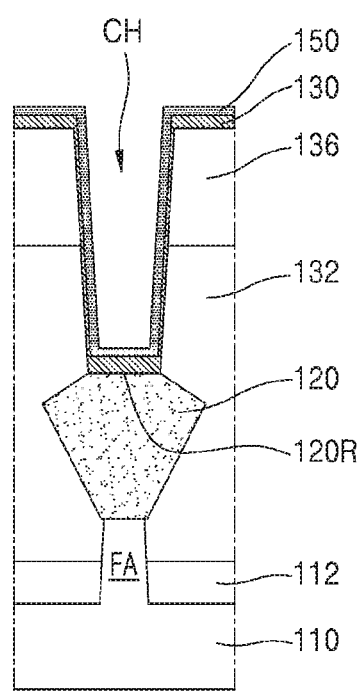

Referring to FIGS. 11A and 11B, a conductive barrier film 150 covering the inner wall of the contact hole CH may be formed on the metal film 130 of a result product, in which the metal film 130 is formed in the recessed region 120R.

The conductive barrier film 150 may be formed to cover an exposed surface of the metal film 130 and the inner wall of the contact hole CH.

The conductive barrier film 150 may include TiN, TaN, AlN, WN, or combinations thereof. In some example embodiments, the conductive barrier film 150 may include a metal nitride having an atomic ratio of a metal to nitrogen of 1:1. For example, the conductive barrier film 150 may include a TiN film having an atomic ratio of Ti:N of 1:1.

In some example embodiments, the conductive barrier film 150 may have a thickness of about 1 Å to about 100 Å. In some example embodiments, the conductive barrier film 150 may be formed using a CVD, PVD, or ALD process, without being limited thereto.

In some example embodiments, to form the conductive barrier film 150 including a TiN film using a CVD process (e.g., a process pyrolyzing a tetrakis-dimethyl-amino-titanium (TDMAT) precursor in an $N_2$ atmosphere).

In some example embodiments, the process of forming the metal film 130 described with reference to FIGS. 10A and 10B, and the process of forming the conductive barrier film 150 described with reference to FIGS. 11A and 11B may be performed in situ without vacuum break between these processes. In some example embodiments, to form the metal film 130 and the conductive barrier film 150, an integrated circuit device fabricating apparatus 400 as described below with reference to FIGS. 22 to 24 may be used.

Referring to 12A to 12B, a metal silicide film 140 may be formed by performing silicidation of at least a portion of the metal film 130 using a silicidation atmosphere while the conductive barrier film 150 is exposed to the silicidation atmosphere.

To form the metal silicide film 140, reaction of a semiconductor material included in the source/drain region 120 with a metal included in the metal film 130 may be derived by performing heat treatment of a result product of FIGS. 11A and 11B, in which the conductive barrier film 150 covering the metal film 130 is formed. As a result, the metal silicide film 140 covering the source/drain region 120 in the recessed portion 120R may be formed.

Figure 12A:
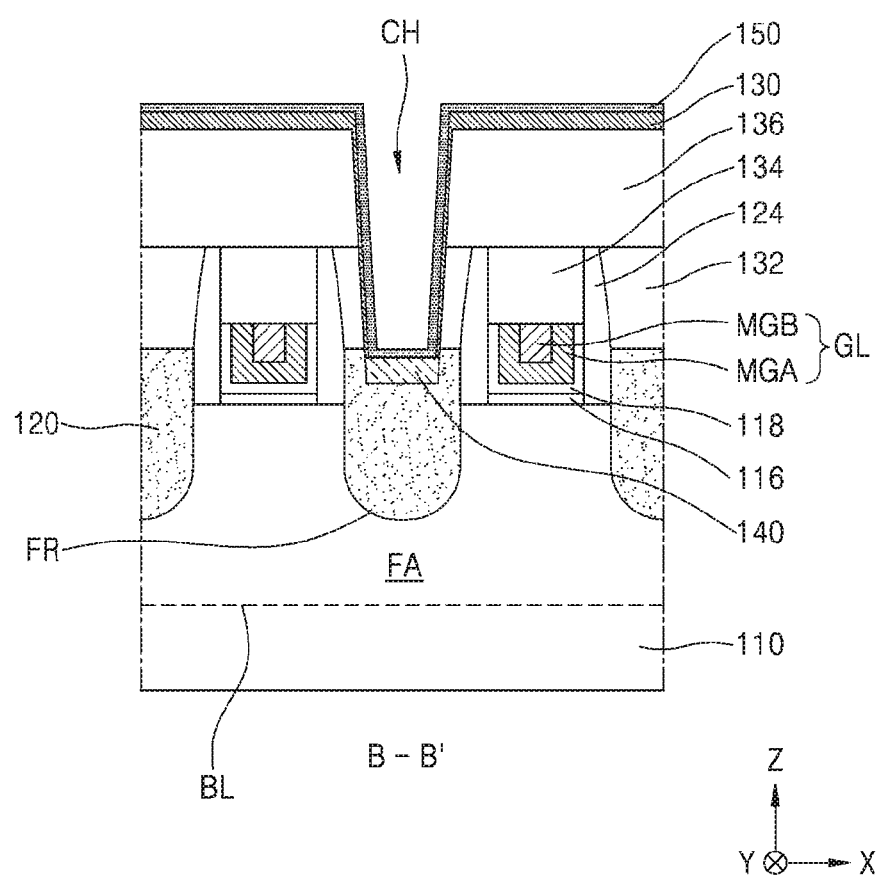
Figure 12B:
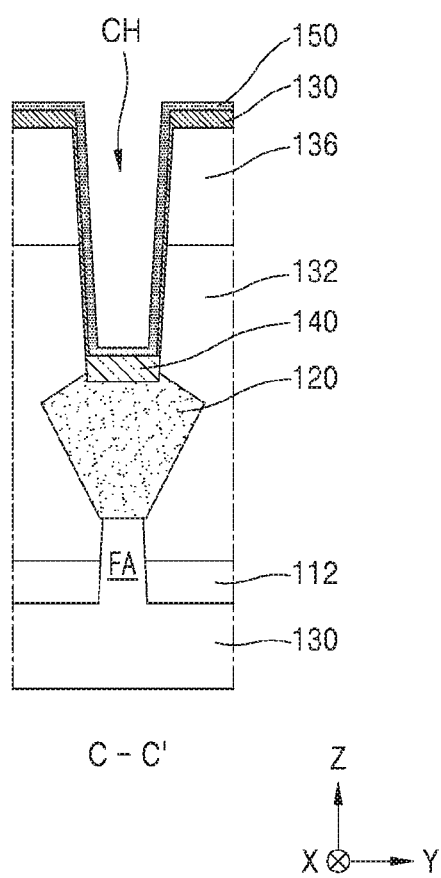

Because the metal silicide film 140 is formed by reaction of the source/drain region 120 with the metal film 130, the metal silicide film 140 may include the same metal as the metal included in the metal film 130. In some example embodiments, an entire portion of the metal film 130, which covers the source/drain region 120, may be used for silicidation, whereby the metal silicide film 140 and the conductive barrier film 150 may directly contact each other after the metal silicide film 140 is formed, as shown in FIGS. 12A and 12B. In some other example embodiments, a portion of the metal film 130, which covers the source/drain region 120, may be used for silicidation, whereby some of the metal film 130 may remain between the metal silicide film 140 and the conductive barrier film 150 after the metal silicide film 140 is formed.

In some example embodiments, although laser annealing may be used to perform the heat treatment process for forming the metal silicide film 140, the inventive concepts are not limited thereto.

When forming the metal silicide film 140, the conductive barrier film 150 may be exposed to the silicidation atmosphere, and thus undesired impurities, for example, oxygen may penetrate into the conductive barrier film 150. If oxygen penetrates into the conductive barrier film 150, when a metal plug filling the contact hole CH is formed on the conductive barrier film 150, adhesion between the metal plug and the conductive barrier film 150 may be deteriorated, and because interface voids generated between the metal plug and the conductive barrier film 150 may lead to an increase in contact resistance and deterioration in electrical characteristics of the integrated circuit device. Thus, reliability of the integrated circuit device may be deteriorated.

Figure 13A:
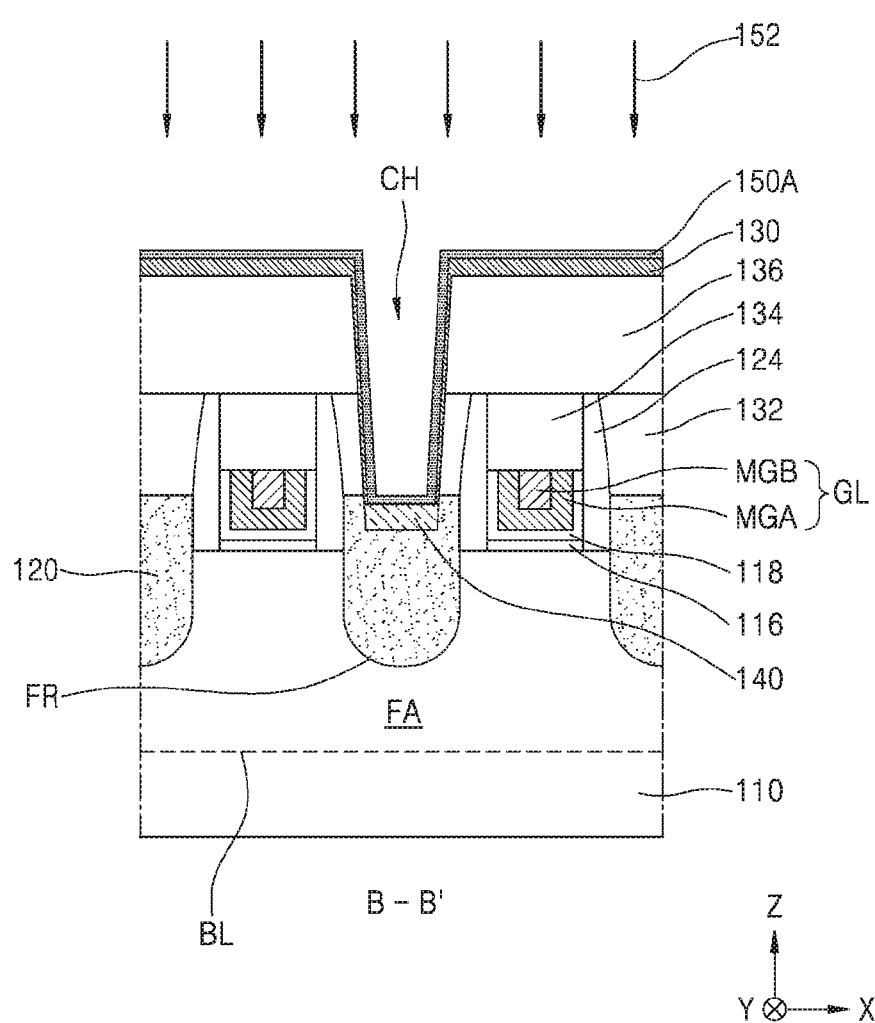
Figure 13B:
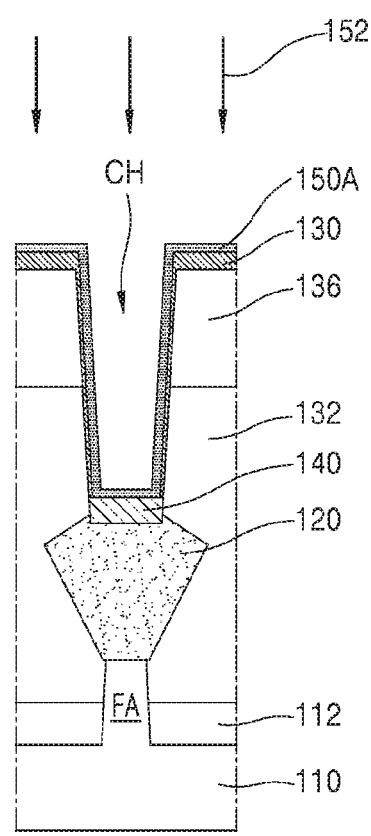

Referring to FIGS. 13A and 13B, a composition-changed conductive barrier film 150A may be formed by treating the conductive barrier film 150 (see FIGS. 12A and 12B), which covers the metal silicide film 140, in an atmosphere 152 including at least one of nitrogen and hydrogen.

The conductive barrier film 150 may be treated in the atmosphere 152, whereby undesired impurities, which penetrated into the conductive barrier film 150 while forming the metal silicide film 140 as described with reference to FIGS. 12A and 12B, can be removed or reduced.

In some example embodiments, to form the composition-changed conductive barrier film 150A, the conductive barrier film 150 covering the metal silicide film 140 may be subjected to plasma treatment or heat treatment in a nitrogen-containing gas atmosphere, thereby reducing an amount of impurities such as oxygen penetrating into the conductive barrier film 150 while increasing an amount of nitrogen in the conductive barrier film 150.

When the conductive barrier film 150 includes a metal nitride having an atomic ratio of a metal to nitrogen of 1:1, the conductive barrier film 150 may be subjected to plasma treatment or heat treatment in a nitrogen-containing gas atmosphere, whereby the conductive barrier film 150A including an N-rich metal nitride film may be obtained due to an increase in an amount of nitrogen in the conductive barrier film 150. As used herein, the term "N-rich metal nitride film" refers to a metal nitride film having a nitrogen content that is greater than a nitrogen content according to a stoichiometric atomic ratio between a metal and nitrogen.

The plasma treatment in the nitrogen-containing gas atmosphere may be performed in an atmosphere of a nitrogen-containing gas including $N_2$, $NH_3$, or combinations thereof. For example, the plasma treatment in the nitrogen-containing gas atmosphere may be performed in an $N_2$ atmosphere. The nitrogen-containing gas atmosphere may further include an inert gas such as Ar, He, Kr, or the like.

The plasma treatment or heat treatment in the nitrogen-containing gas atmosphere may be performed at a temperature of about 300° C. to about 1000° C., for example, about 400° C. to about 450° C.

In some other example embodiments, to form the composition-changed conductive barrier film 150A, the conductive barrier film 150 covering the metal silicide film 140 may be subjected to plasma treatment or heat treatment in a hydrogen-containing gas atmosphere. Here, a reduction reaction may occur in the conductive barrier film 150, and as a result, an amount of impurities such as oxygen penetrating into the conductive barrier film 150 can be reduced.

In some example embodiments, the hydrogen-containing gas atmosphere may be an atmosphere including $H_2$ gas. In some other example embodiments, the hydrogen-containing gas atmosphere may be an atmosphere including $H_2$ gas and an inert gas such as Ar, He, Kr, or the like.

The plasma treatment or heat treatment in the hydrogen-containing gas atmosphere may be performed at a temperature of about 300° C. to about 1000° C., for example, about 400° C. to about 450° C.

In some example embodiments, to form the composition-changed conductive barrier film 150A, the conductive barrier film 150 may be subjected to plasma treatment in a nitrogen-containing gas atmosphere, a hydrogen-containing gas atmosphere, or combinations thereof. Here, while the plasma treatment is performed, the atmosphere 152 on the substrate 110, which may be a nitrogen-containing and/or hydrogen-containing gas atmosphere, may be maintained in a plasma state by applying RF source power of several hundred W to dozens kW thereto. For example, to maintain the atmosphere 152 in a plasma state, an RF source power of about 1000 W to about 10 kW may be applied to the atmosphere 152. Further, the atmosphere 152 may be maintained at a pressure of about 1 mTorr to about 10 Torr.

In some example embodiments, the plasma treatment in the nitrogen-containing and/or hydrogen-containing gas atmosphere may be performed using a gas activated in a direct plasma form. In some other example embodiments, the plasma treatment in the nitrogen-containing and/or hydrogen-containing gas atmosphere may be performed using a gas activated in a remote plasma form.

A heater may be used for the heat treatment in the nitrogen-containing and/or hydrogen-containing gas atmosphere.

The plasma treatment or heat treatment in the nitrogen-containing and/or hydrogen-containing gas atmosphere may be performed for several seconds to several minutes, without being limited thereto. The period of time for performing the plasma treatment or heat treatment may be appropriately selected depending upon temperatures, pressures, gas flow rates, or the like of the atmosphere 152.

In some other example embodiments, to form the composition-changed conductive barrier film 150A, ultraviolet (UV) radiation may be used. For example, the conductive barrier film 150 may be exposed to UV radiation having a wavelength of about 280 nm to about 380 nm for several minutes to dozens minutes, thereby reducing an amount of impurities such as oxygen penetrating into the conductive barrier film 150.

In some example embodiments, the process of forming the metal silicide film 140 described with reference to FIGS. 12A and 12B, and the process of forming the composition-changed conductive barrier film 150A described with reference to FIGS. 13A and 13B may be performed in situ without vacuum break between these processes. In some example embodiments, to form the metal silicide film 140 and the composition-changed conductive barrier film 150A, the integrated circuit device fabricating apparatus 400 as described below with reference to FIGS. 22 to 24 may be used.

FIGS. 14A to 17B are sectional views for explaining a process of forming a metal plug 160P, which fills the contact hole CH, on the composition-changed conductive barrier film 150A.

Figure 14A:
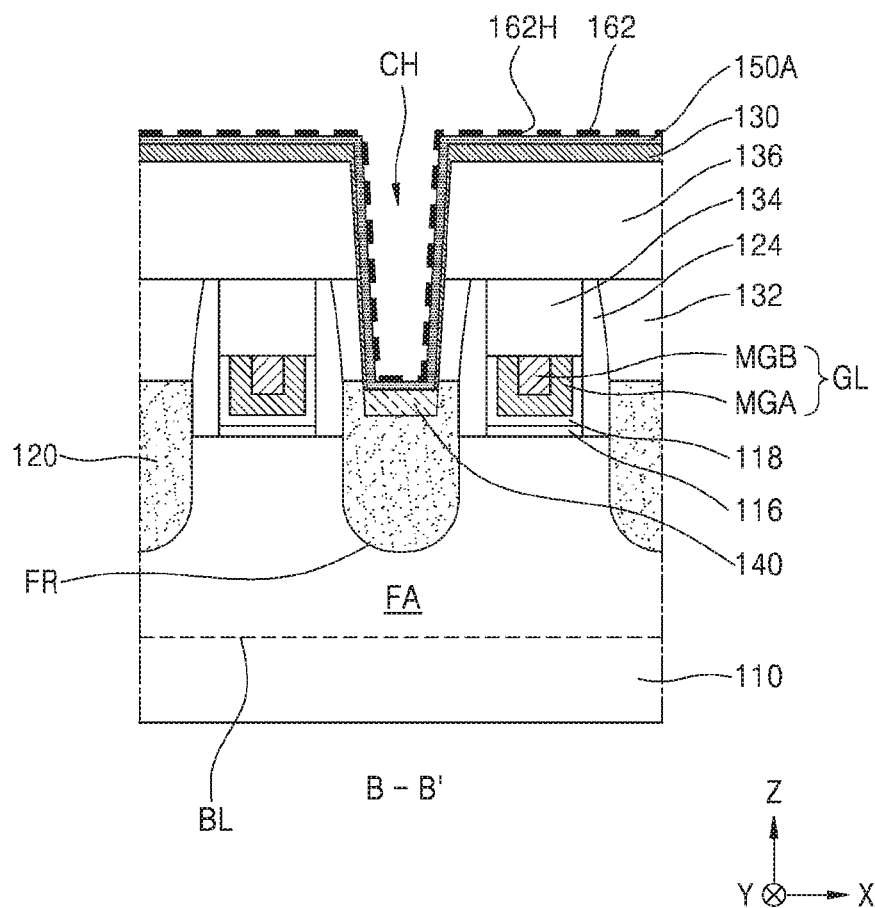
Figure 14B:
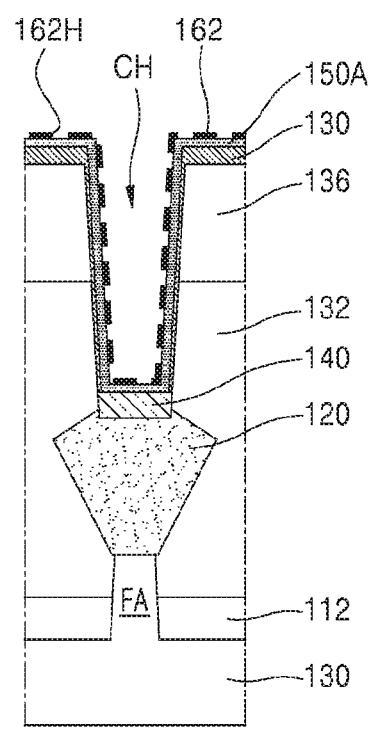

First, referring to FIGS. 14A and 14B, a metal seed layer 162 may be formed on the composition-changed conductive barrier film 150A.

The metal seed layer 162 may be formed to discontinuously extend such that the metal seed layer 162 partially covers an upper surface of the conductive barrier film 150A. Thus, some portions of a surface of the conductive barrier film 150A may be exposed through a plurality of openings 162H on the metal seed layer 162.

The metal seed layer 162 may serve to improve adhesion between the conductive barrier film 150A and a metal filling layer 164 (see FIGS. 15A and 15B), which is formed on the conductive barrier film 150A in a subsequent process.

In some example embodiments, the metal seed layer 162 may include Co, W, Cu, Ag, Au, Al, Ni, Pt, or combinations thereof. In some example embodiments, to form the metal seed layer 162, a PVD, CVD, or ALD process may be used. For example, a PVD process may be used to form the metal seed layer 162.

In some example embodiments, the process of forming the metal seed layer 162 may be omitted.

Figure 15A:
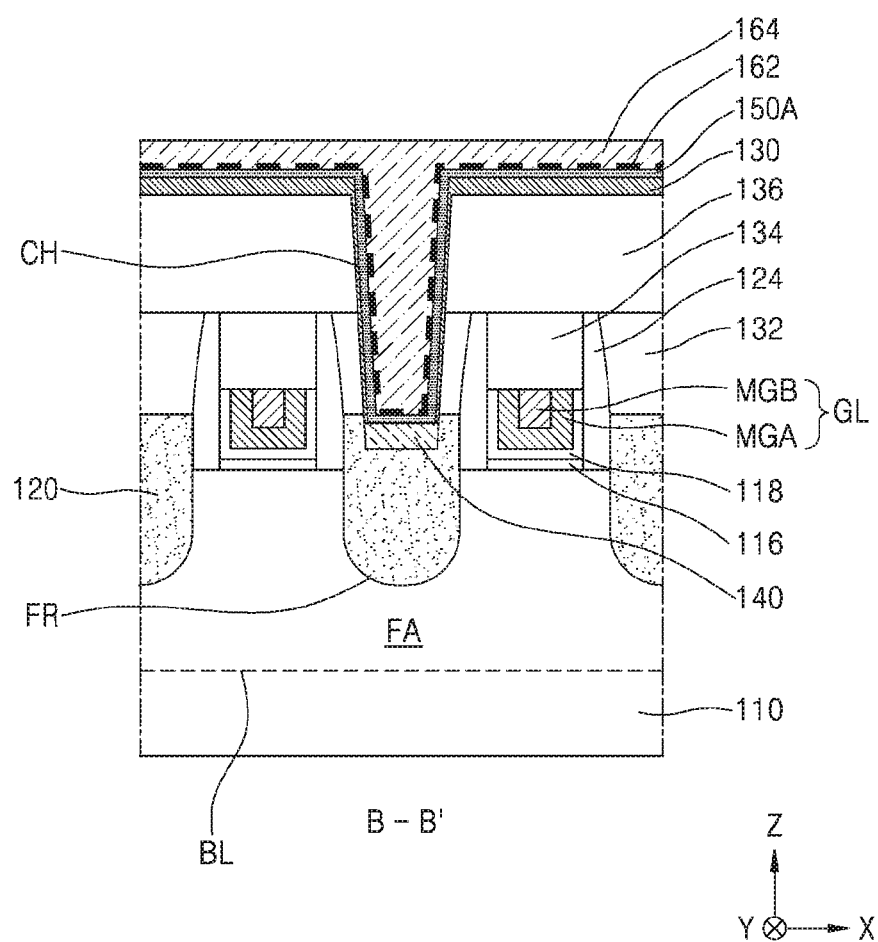
Figure 15B:
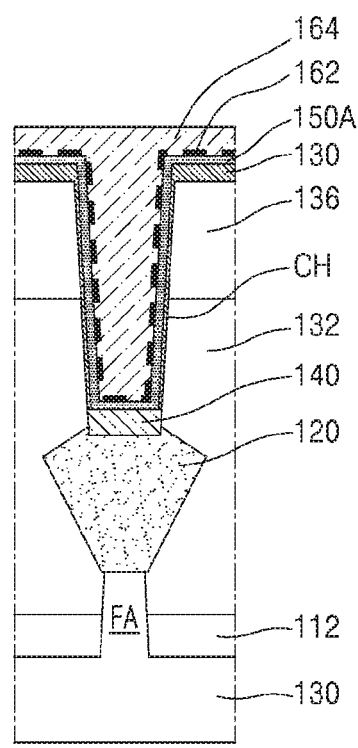

Referring to FIGS. 15A and 15B, the metal filling layer 164 filling the contact hole CH (see FIGS. 14A and 14B) may be formed on the metal seed layer 162.

The metal filling layer 164 may include Co, W, Cu, Ag, Au, Al, Ni, Pt, or combinations thereof. In some example embodiments, to form the metal filling layer 164, a PVD, CVD, or ALD process may be used. For example, a CVD process may be used to form the metal filling layer 164.

In some example embodiments, the metal filling layer 164 may include Co. The metal filling layer 164 including Co may be formed by a CVD or metal-organic CVD (MOCVD) process. To form the metal filling layer 164, various Co precursors may be used. For example, the metal filling layer 164 may be formed by an MOCVD process using $C_{12}H_{10}O_6Co_2$ (dicobalt (hexacarbonyl) tertbutylactylene) or $Co_2(CO_6)(HCC(CH_3)_3)$ (dicobalt hexacarbonyl tertbutyl acetylene) as a Co precursor. Upon the MOCVD process for forming the metal filling layer 164, Ar or $H_2$ gas may be used in conjunction with the Co precursor. The CVD process for forming the metal filling layer 164 may be performed at about 200° C. to about 500° C.

Figure 16A:
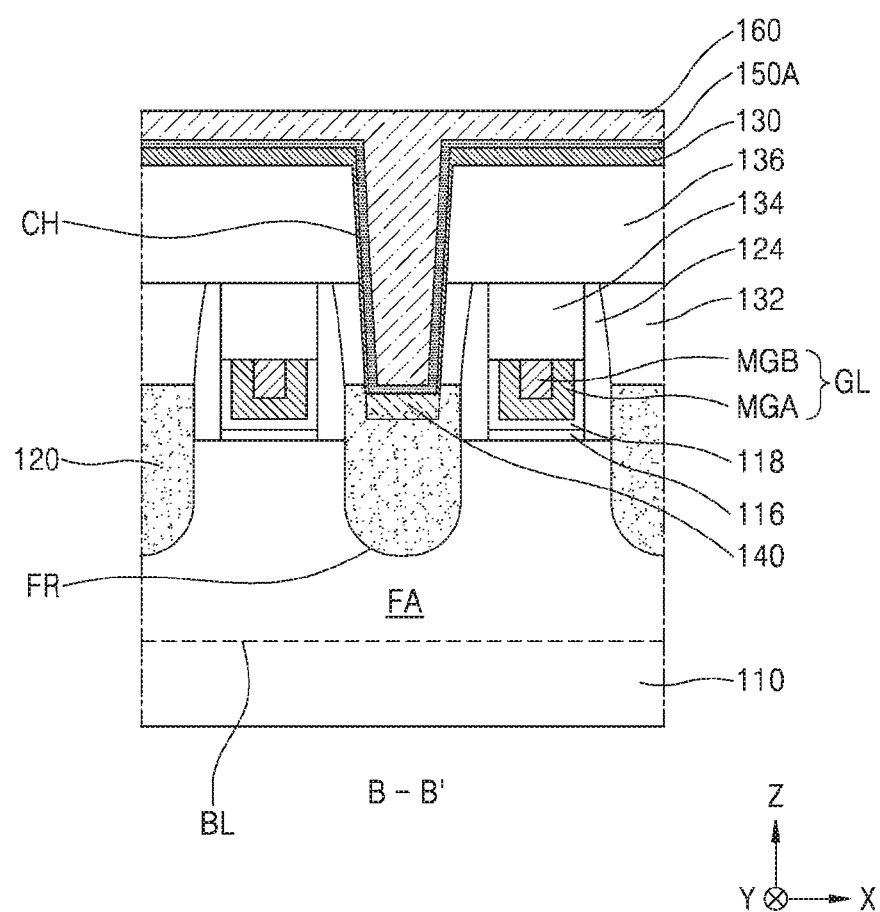
Figure 16B:
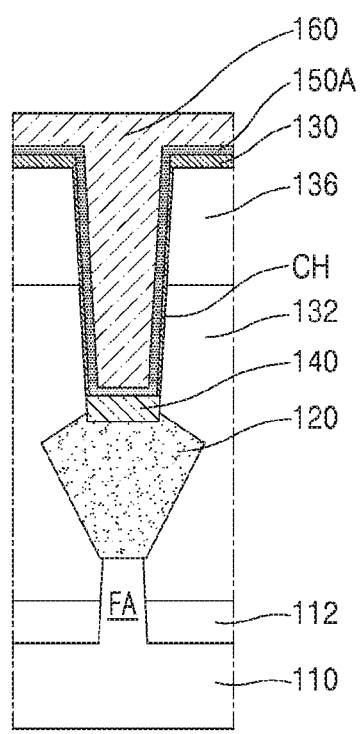

Referring to FIGS. 16A and 16B, the metal seed layer 162 and the metal filling layer 164 may be reflowed by annealing a result product (see 15A and 15B) in which the metal seed layer 162 and the metal filling layer 164 are formed.

The annealing process for reflow may be performed at a temperature of about 200° C. to about 500° C. in an Ar or $H_2$ atmosphere. By the annealing, the metal seed layer 162 and the metal filling layer 164 can be reflowed to be integrated. Thus, a metal plug-purpose conductive layer 160 filling the contact hole CH can be obtained on the conductive barrier film 150A.

In some example embodiments, the metal plug-purpose conductive layer 160 including Co may be formed by forming each of the metal seed layer 162 and the metal filling layer 164 using Co. The metal plug-purpose conductive layer 160 including Co can provide a contact structure which has a relatively low contact resistance even in the contact hole CH having a relatively small critical dimension (CD). Further, when the metal plug-purpose conductive layer 160 including Co is formed, a contact resistance in a contact plug CP to be formed may be reduced, even when the conductive barrier film 150 has a relatively thin thickness as described with reference to FIGS. 11A and 11B. The conductive barrier film 150 can be maintained in a good state without being damaged or consumed. For example, the conductive barrier film 150 may have a relatively thin thickness of about 2 Å to about 20 Å.

The conductive barrier film 150A, which is a result product obtained by performing plasma treatment or heat treatment of the conductive barrier film 150 in a nitrogen-containing and/or hydrogen-containing gas atmosphere or performing UV radiation treatment of the conductive barrier film 150 as described with reference to FIGS. 13A and 13B, may be free from impurities such as oxygen, or may include impurities such as oxygen in a negligibly reduced amount. Thus, adhesion between the conductive barrier film 150A and the metal plug-purpose conductive layer 160 thereon may be improved, and thus a contact structure having a relatively low resistance and relatively high reliability can be obtained.

Figure 17A:
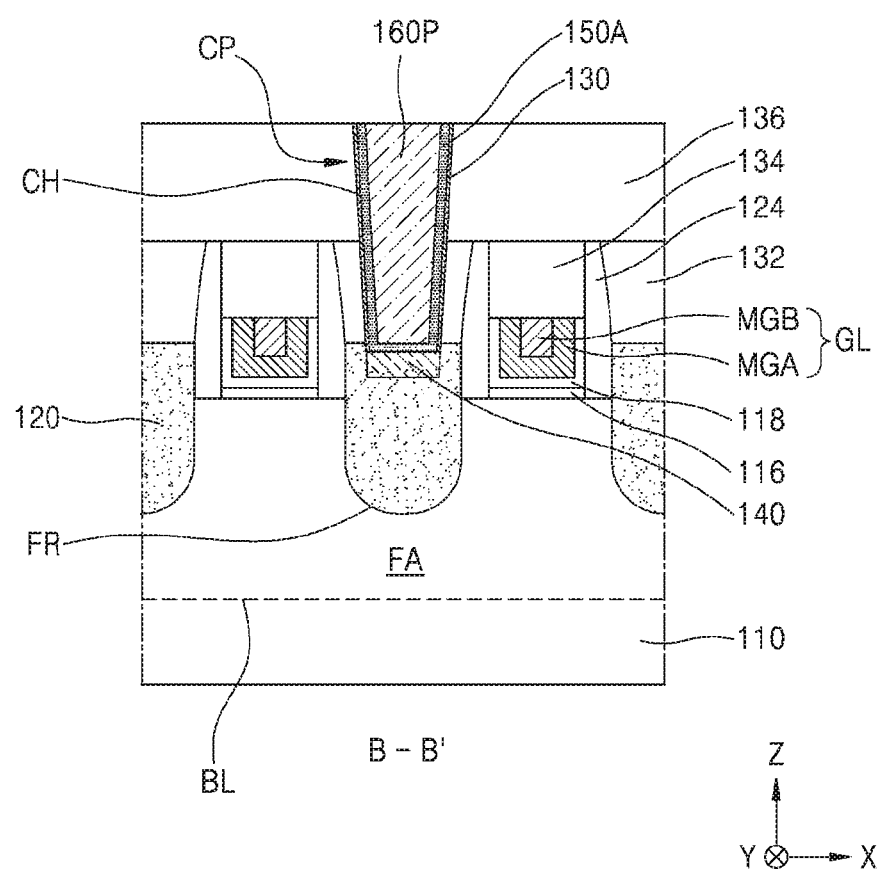
Figure 17B:
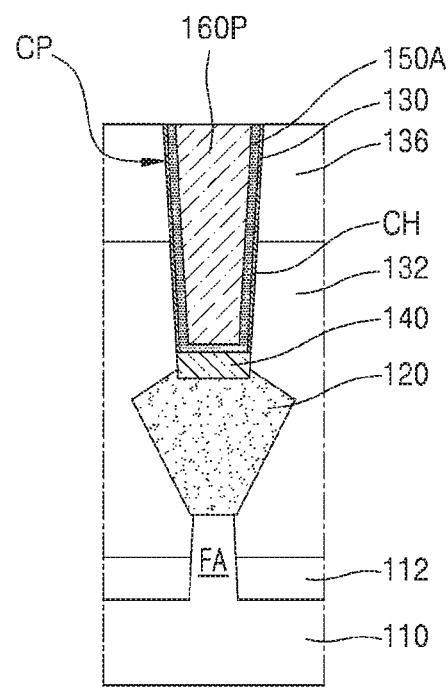

Referring to FIGS. 17A and 17B, a result product, in which the metal plug-purpose conductive layer 160 (see FIGS. 16A and 16B) is formed, may be subjected to planarization until the top surface of the interlayer dielectric 136 is exposed. For example, portions of the metal plug-purpose conductive layer 160, the conductive barrier film 150A, and the metal film 130, which are present outside the contact hole CH, may be removed.

A chemical mechanical polishing (CMP) process may be used for the planarization, without being limited thereto.

The metal plug 160P, the conductive barrier film 150A, the metal silicide film 140, and the metal film 130 may constitute a contact plug CP filling the contact hole CH, wherein the metal plug 160P corresponds to a portion of the metal plug-purpose conductive layer 160 remaining in the contact hole CH, the conductive barrier film 150A surrounds a sidewall and a bottom surface of the metal plug 160P in the contact hole CH, and the metal film 130 extends from the metal silicide film 140 in a Z direction along an extending direction of the metal plug 160P and surrounds an outer sidewall of the conductive barrier film 150A.

Because the integrated circuit device obtained through the example processes described with reference to FIGS. 3A to 17B exhibits improved adhesion between the conductive barrier film 150A and the metal plug 160P thereon, which are included the contact plug CP, a contact structure having a relatively low resistance and relatively high reliability can be obtained. Therefore, a contact resistance between the source/drain region 120 and the contact plug CP can be reduced.

Figure 18:
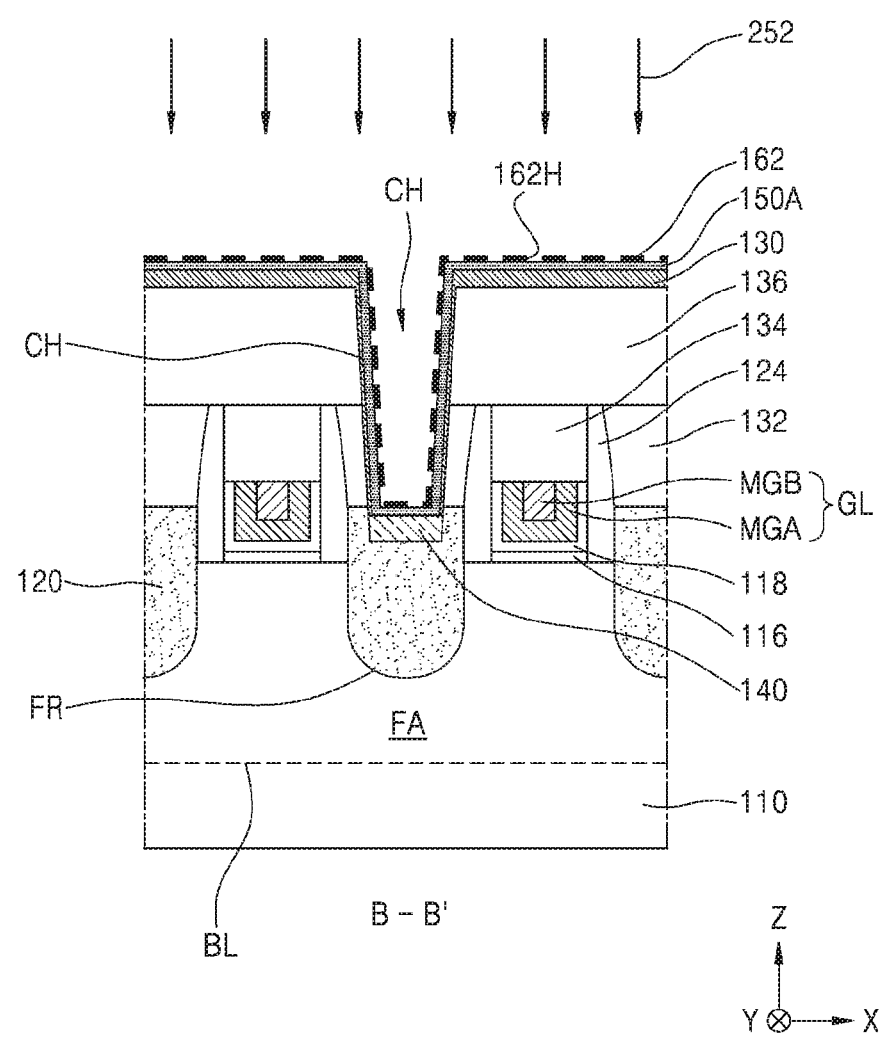
FIG. 18 is a sectional view for explaining a method of fabricating an integrated circuit device according to an example embodiment of the inventive concepts.

FIG. 18 is a sectional view for explaining a method of fabricating an integrated circuit device according to an example embodiment of the inventive concepts. In FIG. 18, the same reference numerals as in FIGS. 3A to 17B denote the same members, and details thereof will be omitted hereinafter.

Referring to FIG. 18, after the processes are performed until the metal seed layer 162 is formed on the composition-changed conductive barrier film 150A as described with reference to FIGS. 3A to 14B, a result product, in which portions of the conductive barrier film 150A are exposed through the plurality of openings 162H of the metal seed layer 162, may be subjected to post-treatment in a post-treatment atmosphere 252 including at least one of nitrogen and hydrogen.

In some example embodiments, to perform the post-treatment, the result product, in which the metal seed layer 162 is formed, may be subjected to plasma treatment or heat treatment in the post-treatment atmosphere 252 including a nitrogen-containing gas. Thus, surfaces of the conductive barrier film 150A, which are exposed through the plurality of openings 162H in the metal seed layer 162, may be exposed to the post-treatment atmosphere 252. Thus, a nitrogen content in the conductive barrier film 150A can be further increased due to the nitrogen-containing gas included in the post-treatment atmosphere 252, and if impurities (e.g., oxygen) remain in the conductive barrier film 150A, such impurities can be removed due to the post-treatment atmosphere 252.

In some example embodiments, to perform the post-treatment, the result product, in which the metal seed layer 162 is formed, may be subjected to plasma treatment or heat treatment in the post-treatment atmosphere 252 including a hydrogen-containing gas. Here, the conductive barrier film 150A may be exposed to the post-treatment atmosphere 252 through the plurality of openings 162H in the metal seed layer 162. Thus, if impurities (e.g., oxygen) remain in the conductive barrier film 150A, such impurities can be removed due to the post-treatment atmosphere 252.

In some example embodiments, to perform the post-treatment, the result product, in which the metal seed layer 162 is formed, may be subjected to UV radiation treatment.

The post-treatment atmosphere 252 described with reference to FIG. 18 may be an atmosphere including at least one of nitrogen and hydrogen, the same as or similar to the atmosphere 152 described with reference to FIGS. 13A and 13B. In some example embodiments, to perform the post-treatment of the result product in which the metal seed layer 162 is formed, the result product may be subjected to plasma treatment, heat treatment, and/or UV radiation treatment in an atmosphere including at least one of nitrogen and hydrogen.

Next, the processes described with reference to FIGS. 15A to 17B are performed, thereby fabricating the integrated circuit device.

Figure 19:
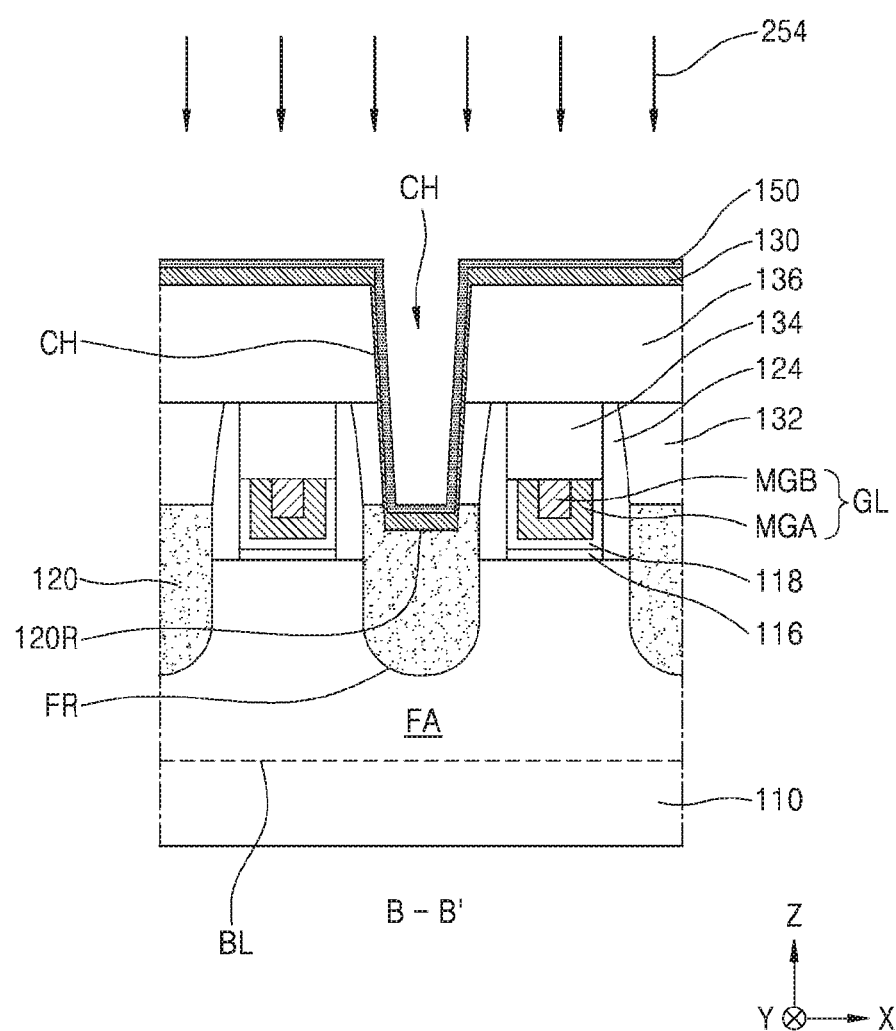
FIG. 19 is a sectional view for explaining a method of fabricating an integrated circuit device according to an example embodiment of the inventive concepts.

FIG. 19 is a sectional view for explaining a method of fabricating an integrated circuit device according to an example embodiment of the inventive concepts. In FIG. 19, the same reference numerals as in FIGS. 3A to 17B denote the same members, and details thereof will be omitted hereinafter.

Referring to FIG. 19, after the processes are performed until the conductive barrier film 150 covering the inner wall of the contact hole CH is formed as described with reference to FIGS. 3A to 11B, and before the process of forming the metal silicide film 140 described with reference to FIGS. 12A to 12B is performed, a result product, in which the conductive barrier film 150 is formed, may be subjected to pre-treatment in a pre-treatment atmosphere 254 including at least one of nitrogen and hydrogen.

In some example embodiments, to perform the pre-treatment, the result product, in which the conductive barrier film 150 is formed, may be subjected to plasma treatment or heat treatment in the pre-treatment atmosphere 254 including a nitrogen-containing gas. Thus, the conductive barrier film 150 may be exposed to the pre-treatment atmosphere 254. Thus, a nitrogen content in the conductive barrier film 150 can be increased due to the nitrogen-containing gas included in the pre-treatment atmosphere 254, and at least some of impurities (e.g., oxygen), which may penetrate into and remain in the conductive barrier film 150 during the process of forming the conductive barrier film 150, can be removed.

In some example embodiments, to perform the pre-treatment, the result product, in which the conductive barrier film 150 is formed, may be subjected to plasma treatment or heat treatment in the pre-treatment atmosphere 254 including a hydrogen-containing gas. Here, as the conductive barrier film 150 is exposed to the pre-treatment atmosphere 254, at least some of impurities (e.g., oxygen), which may penetrate into and remain in the conductive barrier film 150 during the process of forming the conductive barrier film 150, can be removed.

In some example embodiments, to perform the pre-treatment, the result product, in which the conductive barrier film 150 is formed, may be subjected to UV radiation treatment.

The pre-treatment atmosphere 254 described with reference to FIG. 19 may be an atmosphere including at least one of nitrogen and hydrogen, the same as or similar to the atmosphere 152 described with reference to FIGS. 13A and 13B. In some example embodiments, to perform the pre-treatment of the result product, in which the conductive barrier film 150 is formed, the result product may be subjected to plasma treatment, heat treatment, and/or UV radiation treatment in an atmosphere including at least one of nitrogen and hydrogen.

Next, the processes described with reference to FIGS. 12A to 17B, or the processes described with reference to FIG. 18 may be performed, thereby fabricating the integrated circuit device.

Figure 20A:
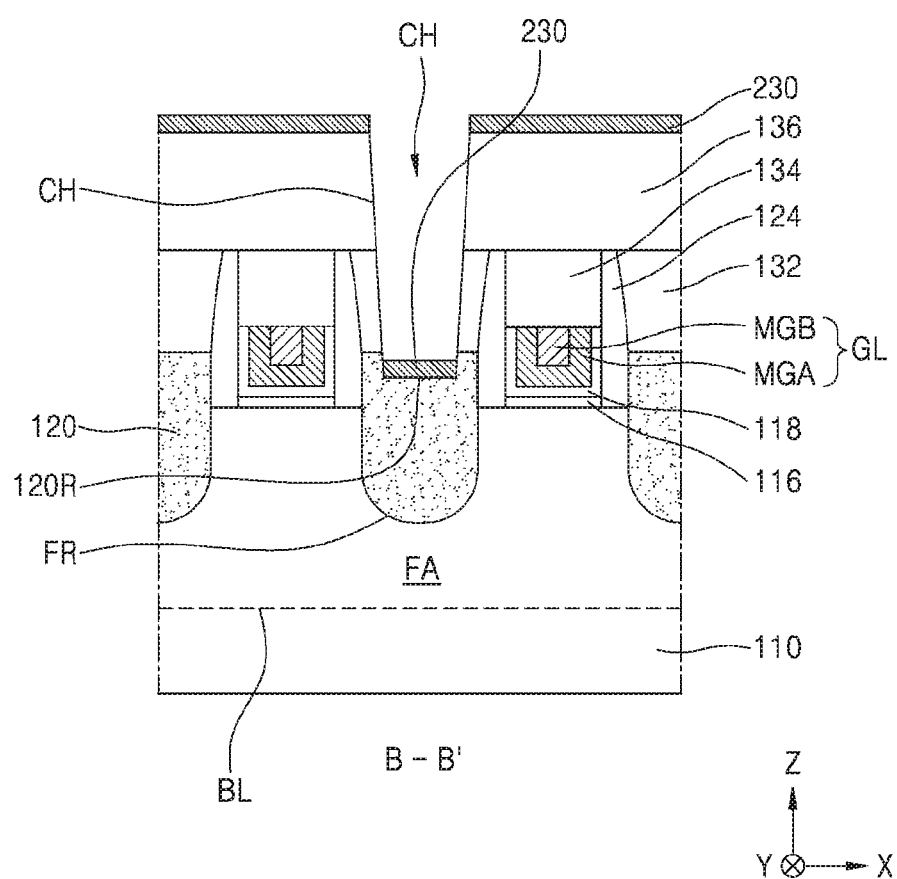
FIGS. 20A to 20C are sectional views shown in accordance with a process order in order to explain a method of fabricating an integrated circuit device according to an example embodiments of the inventive concepts.
Figure 20B:
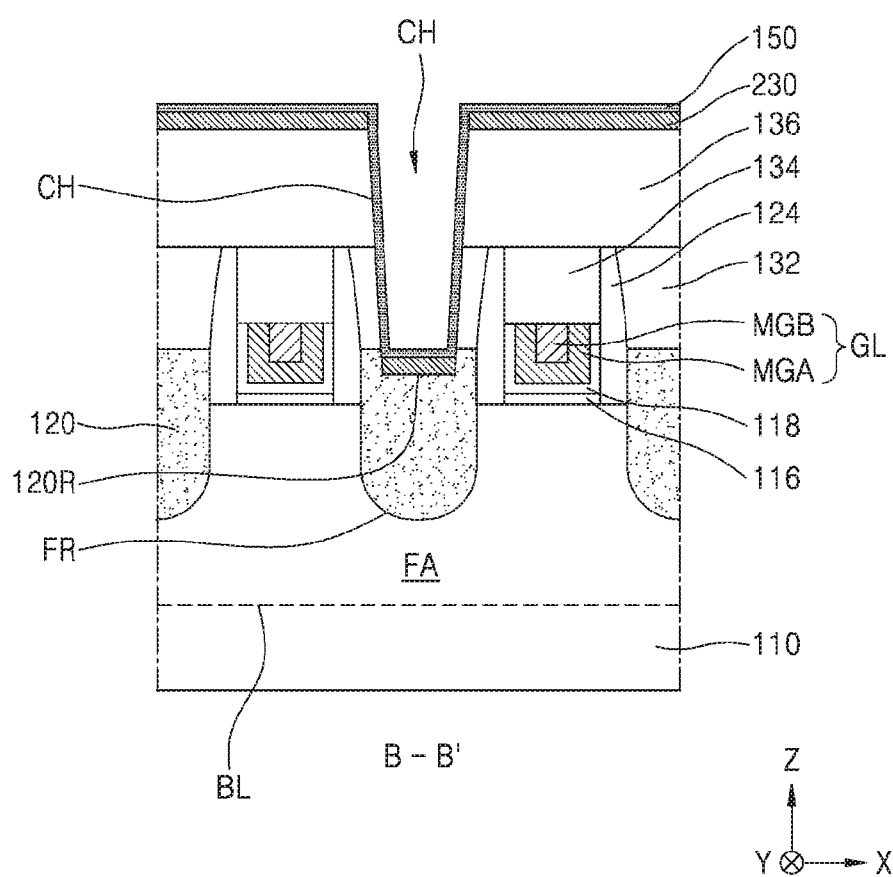
Figure 20C:
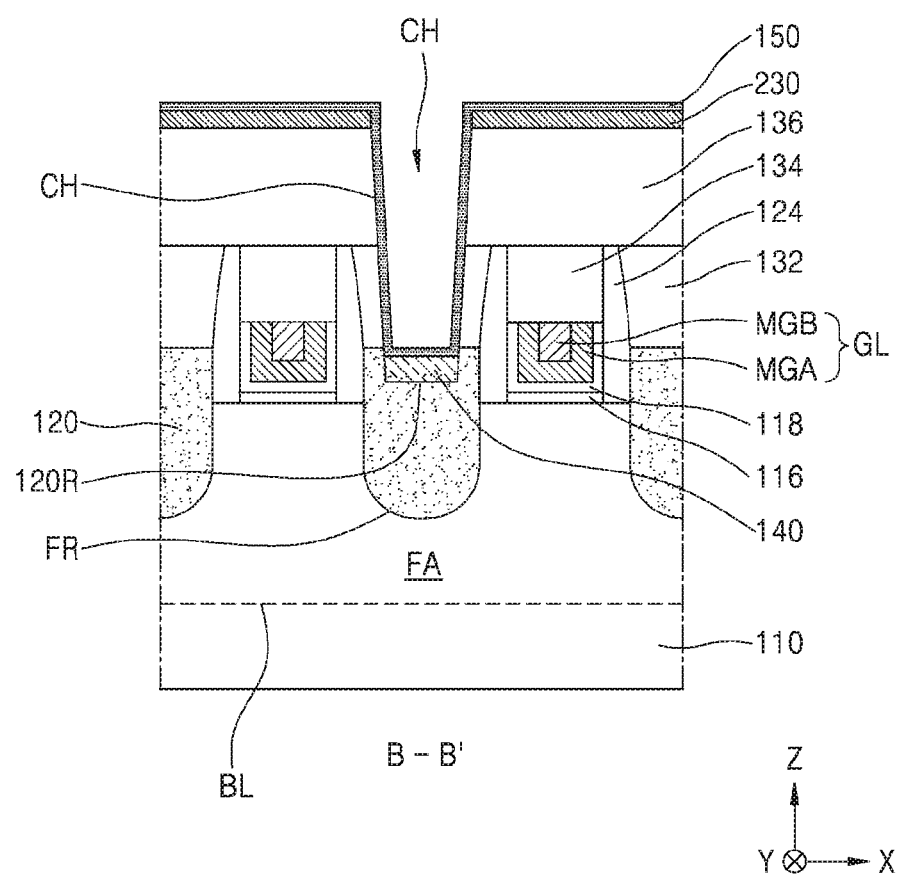

FIGS. 20A to 20C are sectional views shown in accordance with a process order in order to explain a method of fabricating an integrated circuit device according to an example embodiment of the inventive concepts. In FIGS. 20A to 20C, the same reference numerals as in FIGS. 1 to 19 denote the same members, and details thereof will be omitted hereinafter.

Referring to FIG. 20A, after the contact hole CH penetrating the interlayer dielectric 136 and the inter-gate dielectric 132 is formed as described with reference to FIGS. 3A to 9B, a local metal film 230 covering the recessed portion 120R of the source/drain region 120 may be formed.

In some example embodiments, materials constituting the local metal film 230 may be the same film as the metal film 130 with reference to FIGS. 10A and 10B.

In some example embodiments, the local metal film 230 may be formed using a PVD process. The local metal film 230 may be formed to cover a top surface of the source/drain region 120 and a top surface of the interlayer dielectric 136. At least a portion of a sidewall of the inter-gate dielectric 132, and at least a portion of the interlayer dielectric 136 may not be covered with the local metal film 230. Thus, after the local metal film 230 is formed, the inter-gate dielectric 132 and the interlayer dielectric 136, which correspond to a sidewall inside the contact hole CH, may be exposed.

A process of forming the local metal film 230 may be formed by using a process, which is the same as or similar to the process of forming the metal film 130 as described with reference to FIGS. 10A and 10B. However, process conditions may be controlled such that desired step coverage properties are obtained in the process of forming the local metal film 230.

In some example embodiments, after the contact hole CH is formed as described with reference to FIGS. 9A and 9B, an exposed surface of the source/drain region 120 may be cleaned, thereby removing undesired materials such as a native oxide film from the exposed surface of the source/drain region 120. Further, after the surface of the source/drain region 120 is cleaned, the process of forming the local metal film 230 may be performed in situ without vacuum break according to the method described with reference to FIG. 20A.

In some example embodiments, to disperse a portion of the local metal film 230 in the recessed portion 120R such that the local metal film 230 sufficiently covers the top surface of the source/drain region 120, the local metal film 230 may be subjected to a re-sputtering process. For example, the local metal film 230, which is formed by a sputtering process, may be subjected to a second sputtering (e.g., re-sputtering) process using an Ar. During the re-sputtering process, foreign substances such as a native oxide film and the like that may remain on a surface of the local metal film 230, can be removed.

In some example embodiments, the process of forming the local metal film 230, and the re-sputtering process on the local metal film 230 may be performed in situ without vacuum break between these processes.

Referring to FIG. 20B, using a method the same as or similar to the method described with reference to FIGS. 11A and 11B, the conductive barrier film 150 covering the inner wall of the contact hole CH may be formed on a result product, in which the local metal film 230 is formed.

The conductive barrier film 150 may be formed to cover an exposed surface of the local metal film 230 and the inner wall of the contact hole CH. The conductive barrier film 150 may directly contact the inter-gate dielectric 312 and the interlayer dielectric 136, which define the contact hole CH.

Referring to FIG. 20C, using a method the same as or similar to the method described with reference to FIGS. 12A and 12B, the metal silicide film 140 may be formed by performing silicidation of at least a portion of the local metal film 230 using a silicidation atmosphere while the conductive barrier film 150 is exposed to the silicidation atmosphere.

Next, the processes as described with reference to FIGS. 13A to 17B are performed, thereby fabricating the integrated circuit device.

Figure 21A:
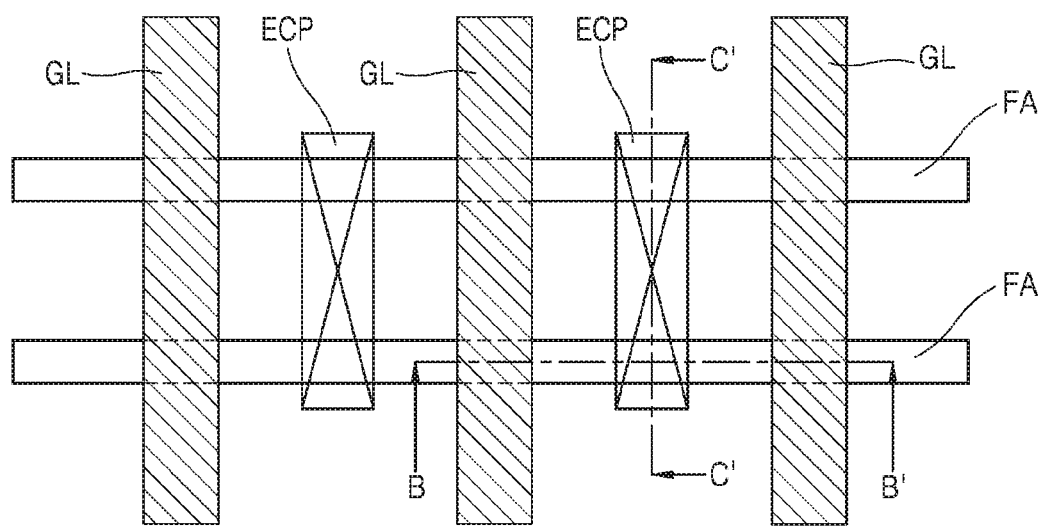
FIGS. 21A to 21C are diagrams for explaining an integrated circuit device according to an example embodiment of the inventive concepts.
Figure 21A:
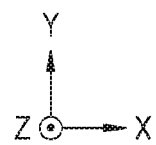
Figure 21B:
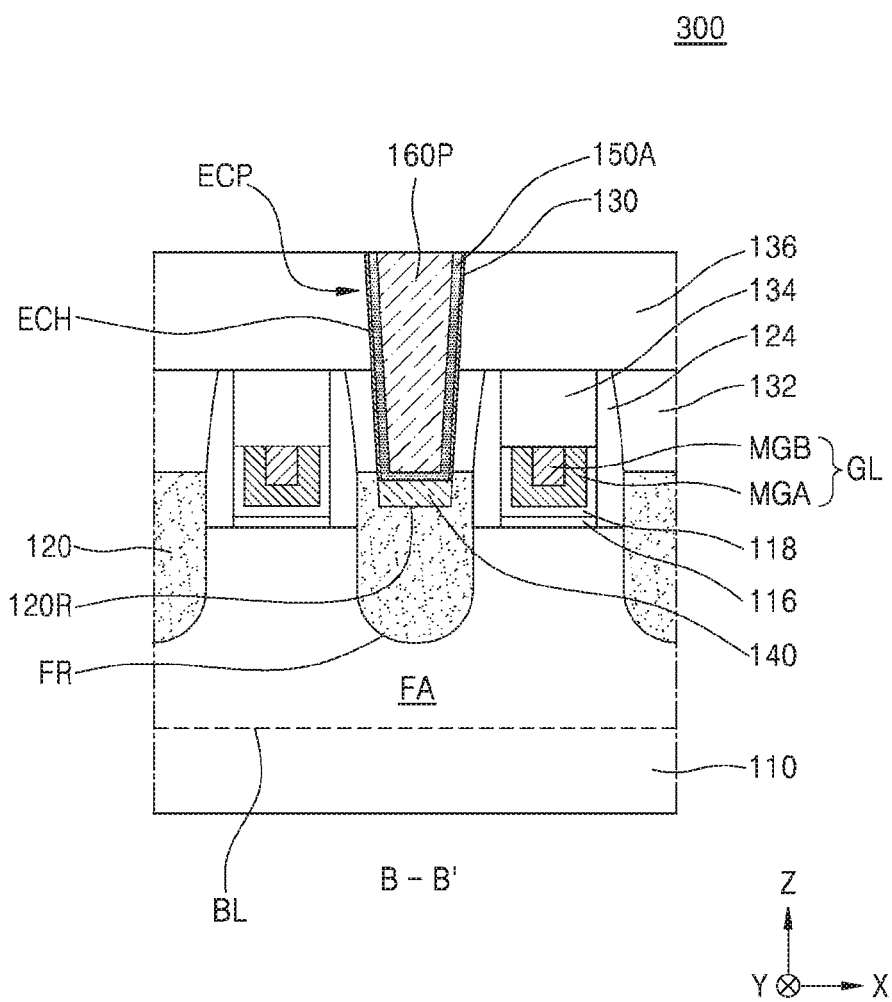
Figure 21C:
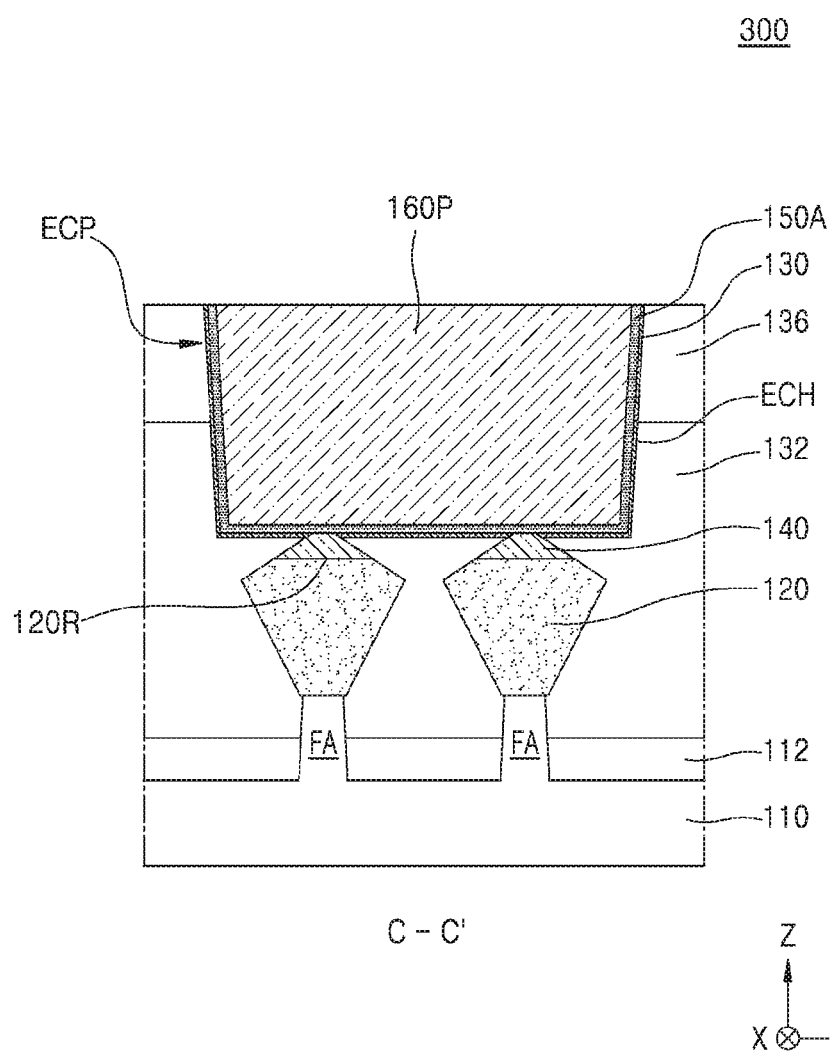

FIGS. 21A to 21C are diagrams for explaining an integrated circuit device according to an example embodiments of the inventive concepts, FIG. 21A is a layout diagram of an integrated circuit device 300 according to example embodiments of the inventive concepts, FIG. 21B is a sectional view of the integrated circuit device 300 taken along a line B-B' of FIG. 21A, and FIG. 21C is a sectional view of the integrated circuit device 300 taken along a line C-C' of FIG. 21A. In FIGS. 21A to 21C, the same reference numerals as in FIGS. 1A to 20C denote the same members, and details thereof will be omitted hereinafter.

The integrated circuit device 300 shown in FIGS. 21A to 21C has mostly the same or similar configuration as the integrated circuit device 100 described with reference to FIGS. 1A to 1C. Further, the integrated circuit device 300 includes a plurality of fin-shaped active regions FA extending parallel to each other on a substrate 110, and a plurality of gate lines GL extends parallel to each other in a second direction (Y direction) while intersecting with the plurality of fin-shaped active regions FA.

A source/drain region 120 may be formed in each of the plurality of fin-shaped active regions FA at both sides of each of the plurality of gate lines GL.

An extended contact plug ECP may extend in a second direction (Y direction) across at least two fin-shaped active regions FA selected from among the plurality of fin-shaped active regions FA. FIGS. 21A to 21C show an example structure in which the extended contact plug ECP (e.g., a single extended contact plug ECP) is formed on two neighboring fin-shaped active regions FA such that a plurality of source/drain regions 120 in the two neighboring fin-shaped active regions FA are electrically connected to each other. However, the inventive concepts are not limited to the example structure shown in FIGS. 21A to 21C. For example, the extended contact plug ECP may be formed on three or more fin-shaped active regions FA extending parallel to each other such that the extended contact plug ECP extend in a direction intersecting with the three or more fin-shaped active regions FA.

The extended contact plug ECP may extend from an inside of the recessed portion 120R on the top surface of the source/drain region 120 in a third direction (Z direction) that is perpendicular to a main plane (X-Y plane) of the substrate 110. The extended contact plug ECP may run through the interlayer dielectric 136 and the inter-gate dielectric 132 in a direction parallel with the main plain such that the contact plug ECP runs over (and is electrically connected to) the plurality of source/drain regions 120.

The extended contact plug ECP may be surrounded by the inter-gate dielectric 132 and the interlayer dielectric 136, and thereby insulated from other surrounding conductive regions. Details of the extended contact plug ECP are the same as or similar to details of the contact plug CP described with reference to FIGS. 1A to 20C.

To fabricate the integrated circuit device 300 shown in FIGS. 21A to 21C as an example, processes the same as or similar to the processes described with reference to FIGS. 9A and 9B may be performed except for a process for forming an extended contact hole ECH. In FIGS. 9A and 9B, the contact hole CH exposing one source/drain region 120 is formed. In FIGS. 21A to 21C, the extended contact hole ECH having a relatively wide width along the Y direction may be formed such that a plurality of source/drain regions 120 is exposed through a bottom surface of the contact hole ECH. Next, the processes described with reference to FIGS. 10A to 17B may be performed, thereby fabricating the integrated circuit device 300.

Although the integrated circuit devices 100, 200, 300 having example structures, and example fabrication methods thereof have been described heretofore with reference to FIGS. 1A to 21C, it should be understood by those skilled in the art that various changes and modifications can be made without departing from the spirit and scope of the inventive concepts.

Although integrated circuit devices, which include Fin-FETs including 3-dimensional structured channels, and fabrication methods thereof have been described with reference to FIGS. 1A to 21C, the inventive concepts are not limited thereto. For example, it will be understood by those skilled in the art that integrated circuit devices including planar MOSFETs having features according to the inventive concepts, and fabrication methods thereof can be provided by making various changes and modifications without departing from the spirit and scope of the inventive concepts.

Figure 22:
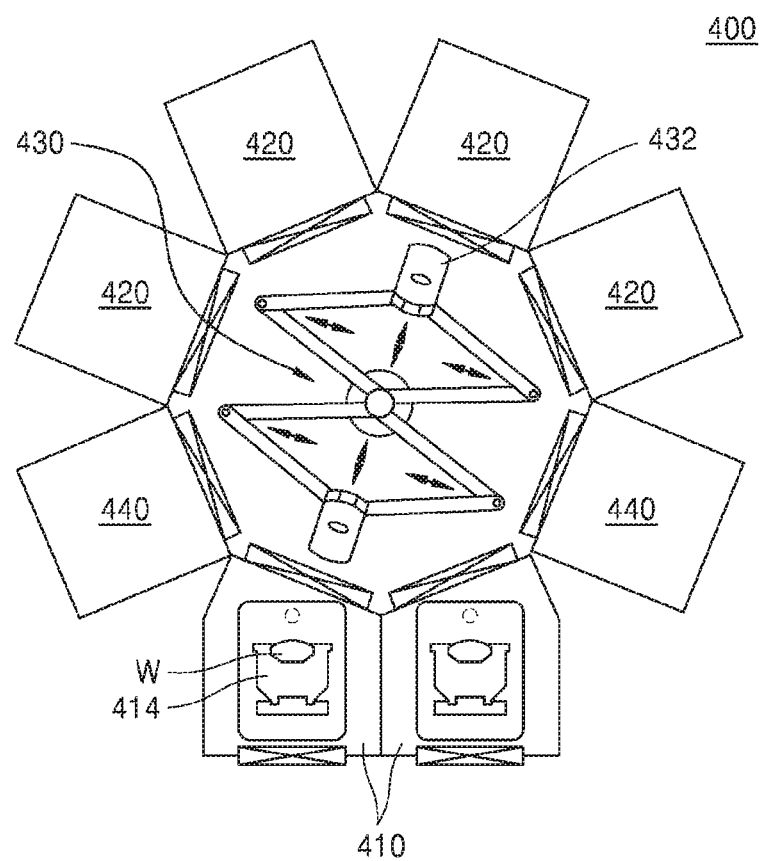
FIG. 22 is a schematic plan view showing main components of an apparatus for fabricating an integrated circuit device according to an example embodiment of the inventive concepts.

FIG. 22 is a schematic plan view showing a configuration of an integrated circuit device fabricating apparatus 400 according to an example embodiment of the inventive concepts.

Referring to FIG. 22, the integrated circuit device fabricating apparatus 400 may include a plurality of load lock chambers 410 capable of accommodating a cassette 414 in which a plurality of substrates W, a plurality of process chambers 420 capable of performing certain semiconductor device fabricating processes on the substrates W, and a transfer chamber 430.

The transfer chamber 430 may include a robot arm 432 transferring the substrate W, and can communicate with the plurality of process chambers 420 and the plurality of load lock chambers 410. The integrated circuit device fabricating apparatus 400 may further include an alignment chamber 440 aligning the substrate W, which is to be subjected to certain semiconductor device fabricating processes in the process chamber 420, in one direction.

The integrated circuit device fabricating apparatus 400 includes a cluster tool, in which the plurality of load lock chambers 410, the plurality of process chambers 420, and the alignment chamber 440 are arranged around the transfer chamber 430 and connected thereto.

The plurality of process chambers 420 may be configured as a degassing chamber capable of performing a degassing process for removing foreign substances such as moisture or impurities from the substrate W.

Figure 23:
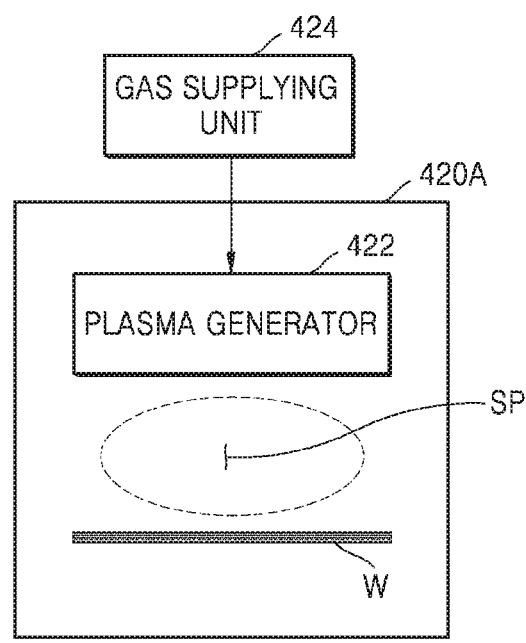
FIG. 23 is a diagram for explaining main components of a process chamber, which may be included in an apparatus for fabricating an integrated circuit device, according to an example embodiment of the inventive concepts.

FIG. 23 is a diagram for explaining a main configuration of a process chamber 420A which may constitute at least one of a plurality of process chambers 420 of integrated circuit device fabricating apparatus 400 shown in FIG. 22.

Referring to FIG. 23, in the process chamber 420A, an ALD, CVD, PVD, UV treatment, etching, degassing, cleaning, or annealing process may be performed on the substrate W.

The process chamber 420A may include a plasma generator 422. The plasma generator 422 may be arranged in a supply path of a reaction gas or a precursor gas supplied from a gas supplying unit 424 and may be configured to provide direct plasma.

The plasma generator 422 may include a power electrode and a ground electrode, which are respectively arranged on upper and lower sides of the process chamber 420A. An electric field for forming plasma may be formed by the power electrode and the ground electrode. The process chamber 420A provides a space SP for forming plasma. A gas injected into the process chamber 420A from the gas supplying unit 424 forms plasma by the electric field formed between the power electrode and the ground electrode, and formed plasma particles may be provided onto the substrate W. As used herein, the term "plasma particles" includes particles, such as radicals, ions, and the like, which are generated due to excitation of a gas into a plasma state, the radicals being neutral particles.

The plasma generator 422 may be configured to provide direct plasma to the substrate W. The gas supplying unit 424 may supply process gases, for example, nitrogen-containing gases and/or hydrogen-containing gases desired for making the atmosphere 152 described with reference to FIGS. 13A and 13B, the post-treatment atmosphere 252 described with reference to FIG. 18, and/or the pre-treatment atmosphere 254 described with reference to FIG. 19. Further, the process gases may be dissociated in the plasma generator 422, and directly provided to the substrate W.

In some example embodiments, using the process chamber 420A, the treatment process in the atmosphere 152 described with reference to FIGS. 13A and 13B, the post-treatment process in the post-treatment atmosphere 252 described with reference to FIG. 18, and/or the pre-treatment process in the pre-treatment atmosphere 254 described with reference to FIG. 19 may be performed.

Figure 24:
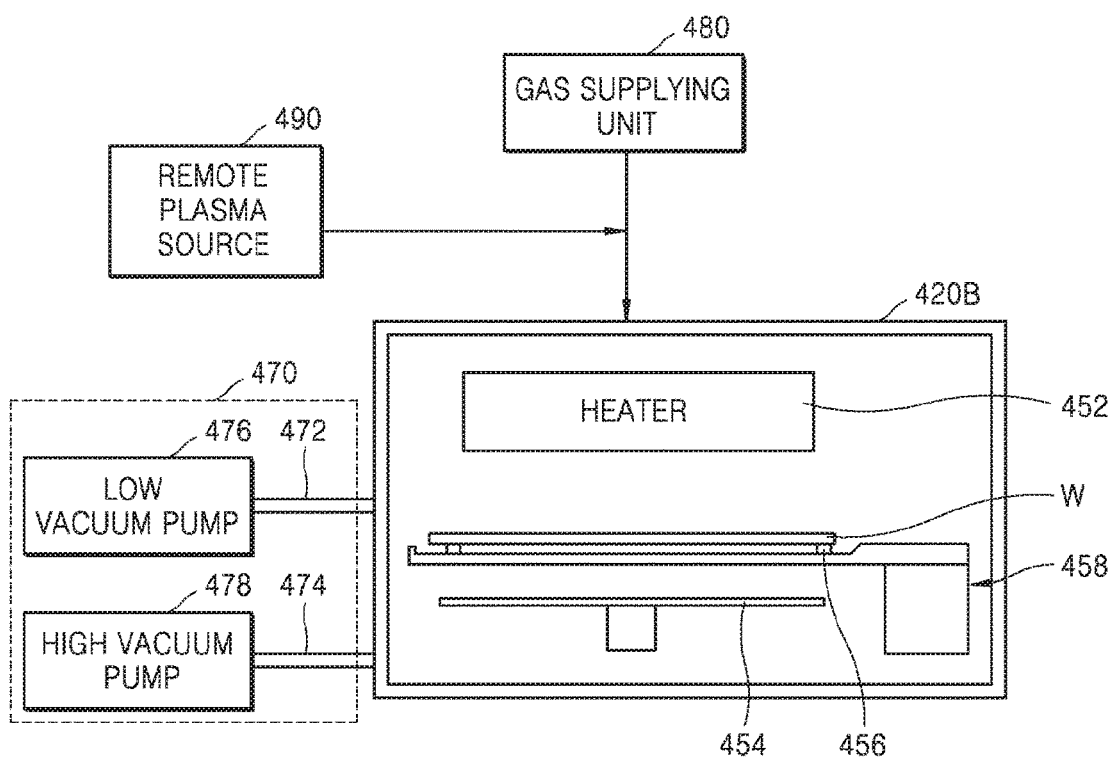
FIG. 24 is a diagram for explaining main components of another process chamber, which may be included in an apparatus for fabricating an integrated circuit device, according to an example embodiment of the inventive concepts.

FIG. 24 is a diagram for explaining a main configuration of a process chamber 420B which may constitute at least one of a plurality of process chambers 420 included in the integrated circuit device fabricating apparatus 400 shown in FIG. 22.

Referring to FIG. 24, the process chamber 420B may be used to perform a degassing, heat treatment, or plasma treatment process. The process chamber 420B may be sealed off from the outside thereof to remove foreign substances, such as moisture, impurities, and the like, remaining on the substrate W, and thereby provide an independent space.

The process chamber 420B may include a heater 452 for heating the substrate W to a relatively high temperature, for example, a temperature of about 300° C. to about 500° C., a rotation chuck 454 configured to rotate the substrate W and arranged in a location, which corresponds to the heater 452, in a lower portion of the process chamber 420B, and a wafer holder 458 for raising the substrate W from the rotation chuck 454. The wafer holder 458 may include a plurality of pins 456 capable of supporting the substrate W.

The wafer holder 458 may lower the substrate W loaded thereon to be safely mounted on the rotation chuck 454. The substrate W safely mounted on the rotation chuck 454 may be heated by heater 452.

The heater 452 may heat the substrate W to a temperature desired for degassing, thereby discharging foreign substances, such as moisture, impurities, and the like, adsorbed onto or included in the substrate W to the outside of the substrate W. In some example embodiments, the heater 452 may include a plurality of heating lamps arranged at regular intervals. The plurality of heating lamps may heat the substrate W inside the process chamber 420B to a desired degassing temperature selected from a range of about 300° C. to about 500° C. using, for example, a power supply voltage applied from the outside of the plurality of heating lamps. In some example embodiments, the heater 452 may include a heater in which a coil emits heat using heat emission due to current by applying power to an electro-thermal wire.

A vacuum exhauster 470 may be connected to the process chamber 420B. The vacuum exhauster 470 may depressurize an inside of the process chamber 420B and allow the inside of the process chamber 420B to be maintained in a vacuum state. The vacuum exhauster 470 may include exhaust lines 472, 474, which can communicate with the process chamber 420B such that a gas inside the process chamber 420B is discharged to the outside of the process chamber 420B, and a low vacuum pump 476 and a high vacuum pump 478, which are respectively connected to the exhaust lines 472, 474.

A gas supplying unit 480, and a remote plasma source 490, which is connected to a middle of a gas supply path from the gas supplying unit 480 to the process chamber 420B, may be connected to the process chamber 420B. The remote plasma source 490 may be arranged in a suitable location for supplying a reactive remote plasma source onto the substrate W inside the process chamber 420B. Process gases, for example, nitrogen-containing gases and/or hydrogen-containing gases desired for making the atmosphere 152 described with reference to FIGS. 13A and 13B, the post-treatment atmosphere 252 described with reference to FIG. 18, and/or the pre-treatment atmosphere 254 described with reference to FIG. 19 may be supplied from the gas supplying unit 480 to remote plasma source 490. Further, the process gases may be dissociated in remote plasma source 490, and transferred to the substrate W.

In some example embodiments, using the process chamber 420B, the treatment process in the atmosphere 152 described with reference to FIGS. 13A and 13B, the post-treatment process in the post-treatment atmosphere 252 described with reference to FIG. 18, and/or the pre-treatment process in the pre-treatment atmosphere 254 described with reference to FIG. 19 may be performed.

Referring again to FIG. 22, the substrate W may be transferred from the load lock chamber 410 to any one of the plurality of process chambers 420 through the transfer chamber 430. The substrate W transferred to the one process chamber 420 may be transferred to another process chamber 420 or the load lock chamber 410 through the transfer chamber 430.

The integrated circuit device fabricating apparatus 400 may include the vacuum exhauster 470 shown in FIG. 24. By the vacuum exhauster 470, a vacuum atmosphere may be maintained in each of the load lock chamber 410, the plurality of process chambers 420, and the transfer chamber 430.

The plurality of process chambers 420 may be used as a PVD chamber, a CVD chamber, a plasma treatment chamber, and a UV treatment chamber.

In some example embodiments, the plasma treatment chamber may be configured as the process chamber 420A including the plasma generator 422 as shown in FIG. 23. In some example embodiments, a CVD, ALD, or PVD process may be performed in the process chamber 420A.

In some example embodiments, the plasma treatment chamber may be configured as the process chamber 420B including the remote plasma source 490 as shown in FIG. 24.

A UV radiation source may be connected to a chamber used as a UV treatment chamber among the plurality of process chambers 420. For example, the UV radiation source may be a UV lamp, a UV laser, a UV electron beam device, or a UV radiation device of a different type therefrom.

In some example embodiments, each of the method of fabricating the integrated circuit device described with reference to FIGS. 3A to 17B, the method of fabricating the integrated circuit device described with reference to FIG. 18, the method of fabricating the integrated circuit device described with reference to FIG. 19, and the method of fabricating the integrated circuit device described with reference to FIGS. 20A to 20C may be performed using the integrated circuit device fabricating apparatus 400 described with reference to FIGS. 22 to 24. For example, at least one of the process of forming the metal film 130 described with reference to FIGS. 10A and 10B, the process of forming the conductive barrier film 150 described with reference to FIGS. 11A and 11B, the process of forming the metal silicide film 140 described with reference to FIGS. 12A and 12B, the process of forming the composition-changed conductive barrier film 150A described with reference to FIGS. 13A and 13B, the process of forming the metal seed layer 162 described with reference to FIGS. 14A and 14B, the process of forming the metal filling layer 164 described with reference to FIGS. 15A and 15B, the reflow process described with reference to FIGS. 16 and 16B, the post-treatment process of the result product, in which the metal seed layer 162 is formed, as described with reference to FIG. 18, and the pre-treatment process of the conductive barrier film 150 described with reference to FIG. 19 may be performed using the integrated circuit device fabricating apparatus 400 described with reference to FIGS. 22 to 24.

Using the integrated circuit device fabricating apparatus 400 shown in FIG. 22, various processes may be consecutively performed in situ in the plurality of process chambers 420 without vacuum break.

In some example embodiments, at least two consecutive processes selected from among a first process of forming a metal film, for example, the metal film 130 shown in FIGS. 10A and 10B or the local metal film 230 shown in FIG. 20A by a PVD process, a second process of forming a conductive barrier film, for example, the conductive barrier film 150 shown in FIGS. 11A and 11B or the conductive barrier film 150 shown in FIG. 20B by a CVD process, a third process of forming the metal silicide film 140 by performing silicidation of at least a portion of the metal film 130 using a silicidation atmosphere while the conductive barrier film 150 is exposed to the silicidation atmosphere, and a fourth process of forming the composition-changed conductive barrier film 150A by performing plasma treatment, heat treatment, or UV treatment of the conductive barrier film 150 may be consecutively performed in the integrated circuit device fabricating apparatus 400 without vacuum break.

Figure 25:
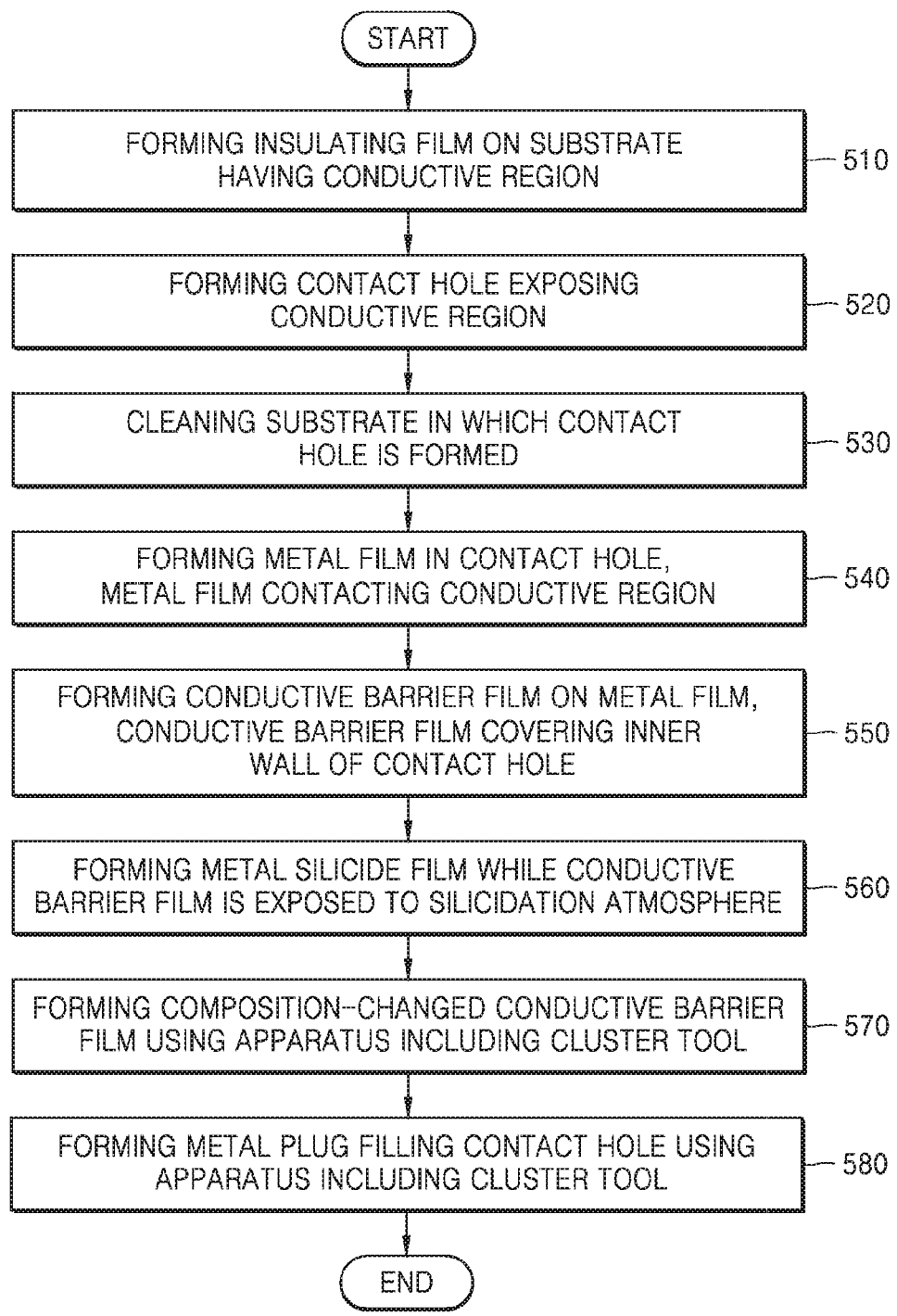
FIG. 25 is a flow chart for explaining a method of fabricating an integrated circuit device according to an example embodiment of the inventive concepts.

FIG. 25 is a flow chart for explaining a method of fabricating an integrated circuit device according to an example embodiment of the inventive concepts.

Referring to FIG. 25, in a process 510, a dielectric may be formed on a substrate having a conductive region.

In some example embodiments, to perform the process 510, using the methods as described with reference to FIGS. 3A to 8B, processes may be performed until the inter-gate dielectric 132 and the interlayer dielectric 136 are formed on the substrate 110 in which the source/drain region 120 is formed. In the process 510, the conductive region may correspond to the source/drain region 120.

In a process 520, a contact hole, which penetrates the dielectric and exposes the conductive region, may be formed.

In some example embodiments, to perform the process 520, using the method as described with reference to FIGS. 9A to 9B, the contact hole CH penetrating the interlayer dielectric 136 and the inter-gate dielectric 132 may be formed by sequentially etching the interlayer dielectric 136 and the inter-gate dielectric 132.

In a process 530, the substrate, in which the contact hole is formed, may be cleaned.

In some example embodiments, to perform the process 530, using the method as described with reference to FIGS. 9A to 9B, the substrate 110, in which the contact hole CH is formed, may be cleaned.

In a process 540, a metal film contacting the conductive region may be formed in the contact hole.

In some example embodiments, to perform the process 540, using the method as described with reference to FIGS. 10A to 10B, the metal film 130 contacting the source/drain region 120 may be formed in the contact hole CH.

In a process 550, a conductive barrier film covering an inner wall of the contact hole may be formed on the metal film.

In some example embodiments, to perform the process 550, using the method as described with reference to FIGS. 11A to 11B, the conductive barrier film 150 covering the metal film 130 inside and outside the contact hole CH may be formed.

In some example embodiments, the process 540 and the process 550 may be consecutively performed in situ in the integrated circuit device fabricating apparatus 400 shown in FIG. 22 without vacuum break.

In a process 560, a metal silicide film may be formed by performing silicidation of at least a portion of the metal film using a silicidation atmosphere while the conductive barrier film is exposed to the silicidation atmosphere.

In some example embodiments, to perform the process 560, using the method as described with reference to FIGS. 12A to 12B, the metal silicide film 140 may be formed by performing silicidation of at least a portion of the metal film 130 using a silicidation atmosphere while the conductive barrier film 150 is exposed to the silicidation atmosphere.

In some example embodiments, the process 550 and the process 560 may be consecutively performed in situ in the integrated circuit device fabricating apparatus 400 shown in FIG. 22 without vacuum break. In some example embodiments, the process 550 and the process 560 may be performed in the same chamber.

In a process 570, a composition-changed conductive barrier film may be formed by treating the conductive barrier film covering the metal silicide film in an atmosphere including at least one of nitrogen and hydrogen in an apparatus which includes a cluster tool including a plurality of process chambers.

In some example embodiments, the cluster tool may be configured as the integrated circuit device fabricating apparatus 400 described with reference to in FIGS. 22 to 24.

In some example embodiments, to perform the process 570, using the method as described with reference to FIGS. 13A to 13B, the composition-changed conductive barrier film 150A may be formed by treating the conductive barrier film 150 (see FIGS. 12A and 12B) covering the metal silicide film 140 in the atmosphere 152 including at least one of a nitrogen atom and a hydrogen atom.

In some example embodiments, to perform the process 570, at least one process chamber 420 selected from among the plurality of process chambers 420 included in the integrated circuit device fabricating apparatus 400 shown in FIG. 22 may be used. The chamber performing the process 570 among the plurality of process chambers 420 may be a plasma treatment chamber, a heat treatment chamber, or a UV treatment chamber. For example, the chamber performing the process 570 may be the process chamber 420A shown in FIG. 23, or the process chamber 420B shown in FIG. 24.

In some example embodiments, the process 560 and the process 570 may be consecutively performed in situ in the integrated circuit device fabricating apparatus 400 shown in FIG. 22 without vacuum break.

In a process 580, using the apparatus including the cluster tool, a metal plug filling the contact hole may be formed on the composition-changed conductive barrier film.

In some example embodiments, to perform the process 580, using the methods as described with reference to FIGS. 14A to 17B, the metal plug 160P filling the contact hole CH may be formed on the composition-changed conductive barrier film 150A.

In some example embodiments, to perform the process 580, at least two process chambers 420 selected from among the plurality of process chambers 420 included in the integrated circuit device fabricating apparatus 400 shown in FIG. 22 may be used. For example, the process of forming the metal seed layer 162, which is described with reference to FIGS. 14A and 14B, may be performed using a PVD, CVD, or ALD chamber included in the plurality of process chambers 420, the process of forming the metal filling layer 164, which is described with reference to FIGS. 15A and 15B, may be performed using a CVD chamber included in the plurality of process chambers 420, and the reflow process of the metal seed layer 162 and the metal filling layer 164, which is described with reference to FIGS. 16A and 16B may be performed in the same chamber as the chamber used for forming the metal filling layer 164. The reflow process may be performed by heating the substrate 110 to a temperature of about 200° C. to about 500° C. The process of forming the metal seed layer 162, the process of forming the metal filling layer 164, and the reflow process may be consecutively performed using the integrated circuit device fabricating apparatus 400 shown in FIG. 22, without vacuum break.

In some example embodiments, the process 570 and the process 580 may be consecutively performed in situ in the integrated circuit device fabricating apparatus 400 shown in FIG. 22, without vacuum break.

Figure 26:
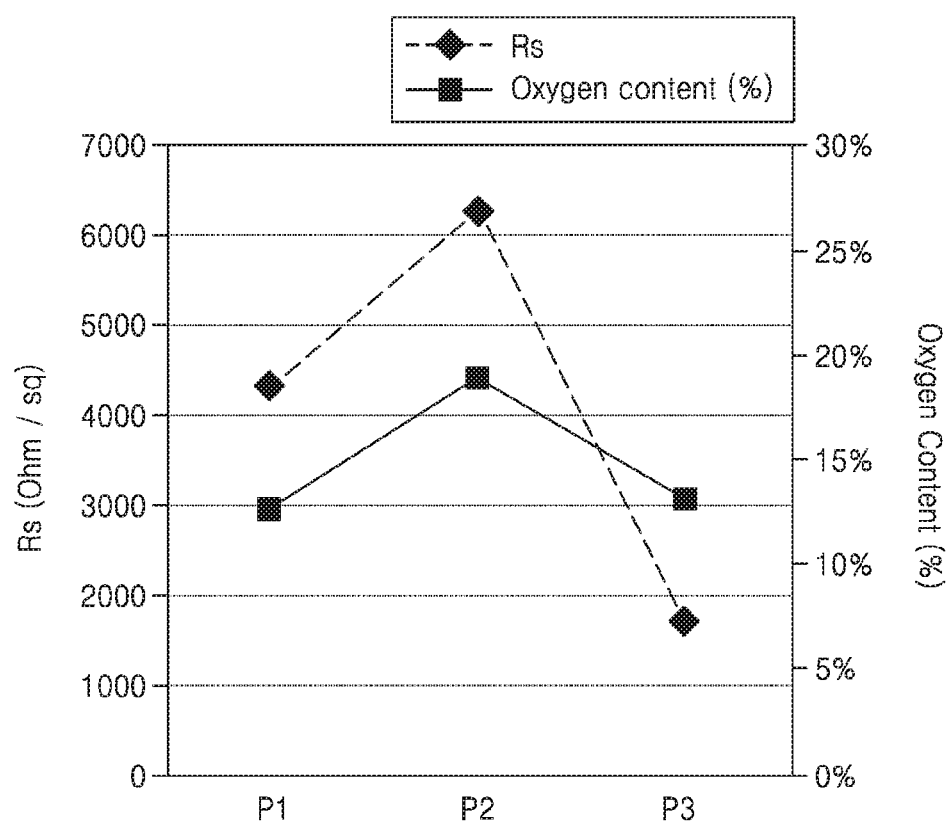
FIG. 26 is a graph depicting a change in resistance of a conductive barrier film formed in accordance with a method of fabricating an integrated circuit device according to an example embodiment of the inventive concepts, and a change in oxygen content in the conductive barrier film, as measured along with process stages for forming the conductive barrier film.

FIG. 26 is a graph depicting a change in resistance Rs of a conductive barrier film formed in accordance with a method of fabricating an integrated circuit device in accordance with an example embodiment of the inventive concepts, and a change in oxygen content in the conductive barrier film, as measured along with process stages for forming the conductive barrier film.

For evaluation of FIG. 26, the resistance Rs and the oxygen content in the conductive barrier film were measured at each of the following time points P1, P2, and P3. The time point P1 denotes a time point right after the conductive barrier film 150 was formed (e.g., before the metal silicide film 140 was formed) in the methods as described with reference to 3A to 11B (P1). The time point P2 denotes a time point right after the metal silicide film 140 was formed in the methods as described with reference to 11A to 12B (P2). The time point P3 denotes a time point right after the composition-changed conductive barrier film 150A was formed in the method as described with reference to 13A to 13B (P3). Here, to form the composition-changed conductive barrier film 150A, the conductive barrier film was subjected to plasma treatment in an $N_2$ atmosphere.

From results of FIG. 26, although the resistance and the oxygen content in the conductive barrier film were increased right after the metal silicide film 140 was formed (P2) as compared with those right after the conductive barrier film 150 was formed. Each of the resistance and the oxygen content in the conductive barrier film 150 was reduced after the conductive barrier film 150 was subjected to plasma treatment in the $N_2$ atmosphere (P3).

As can be seen from the results of FIG. 26, after the metal silicide film 140 was formed, the conductive barrier film 150 covering the metal silicide film 140 was subjected to plasma treatment in the $N_2$ atmosphere. Thus, the oxygen content in the conductive barrier film can be reduced. Therefore, when a metal plug is formed on the conductive barrier film in a subsequent process, adhesion between the conductive barrier film and the metal plug can be improved, generation of voids due to poor adhesion therebetween can be suppressed, and thus a contact structure having a relatively low resistance and relatively high reliability can be provided.

Figure 27:
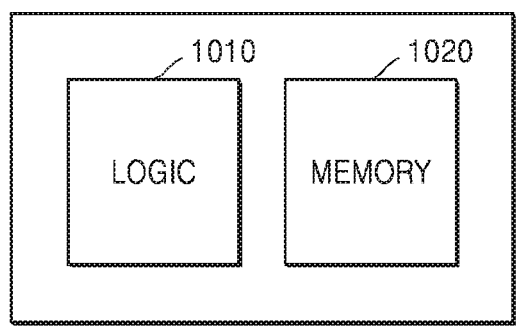
FIG. 27 is a block diagram of an electronic device according to an example embodiment of the inventive concepts.

FIG. 27 is a block diagram of an electronic device according to an example embodiment of the inventive concepts.

Referring to FIG. 27, an electronic device 1000 includes a logic area 1010 and a memory area 1020.

The logic area 1010 may include various logic cells including a plurality of circuit elements, such as a transistor, a register, and the like, as standard cells performing desired logic functions, such as a counter, a buffer, and the like. The logic cells may constitute, for example, AND, NAND, OR, NOR, exclusive OR (XOR), exclusive NOR (XNOR), inverter (INV), adder (ADD), buffer (BUF), delay (DLY), filter (FILL), multiplexer (MXT/MXIT), OR/AND/IN-VERTER (OAI), AND/OR (AO), AND/OR/INVERTER (AOI), D flip-flop, reset flip-flop, master-slave flip-flop, latch, or the like, without being limited thereto.

The memory 1020 may include at least one of an SRAM, a DRAM, an MRAM, an RRAM, and a PRAM.

At least one of the logic area 1010 and the memory area 1020 may include at least one of integrated circuit devices fabricated by the methods according to example embodiments of the inventive concepts, for example, the integrated circuit devices 100, 200, 300 described with reference to FIGS. 1A to 21C and integrated circuit devices having various structures changed and modified therefrom without departing from the spirit and scope of the inventive concepts.

Figure 28:
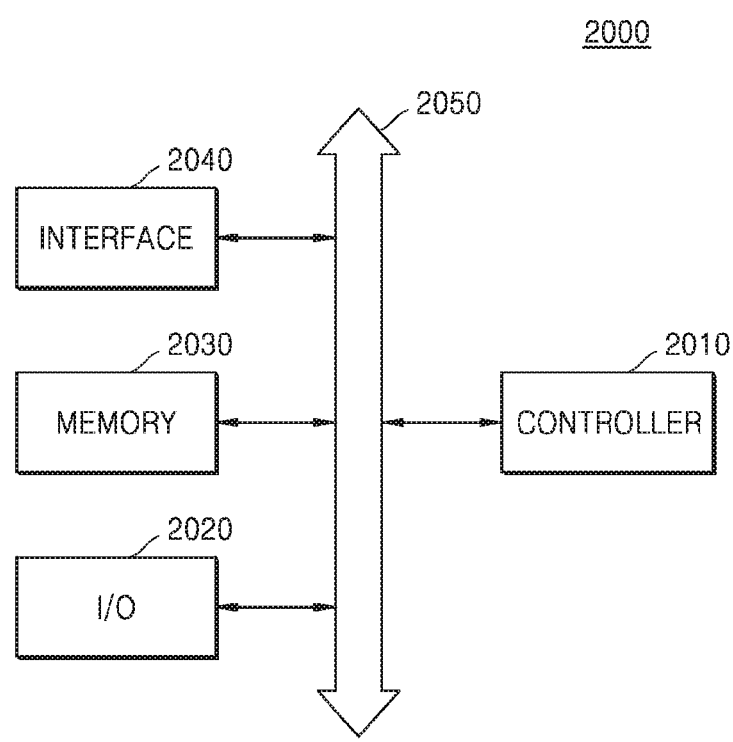
FIG. 28 is a block diagram of an electronic system according to an example embodiment of the inventive concepts.

FIG. 28 is a block diagram of an electronic system according to an example embodiment of the inventive concepts.

Referring to FIG. 28, an electronic system 2000 includes a controller 2010, an input/output (I/O) device 2020, a memory 2030, and an interface 2040, and these components are connected to each other through a bus 2050.

The controller 2010 may include at least one of a microprocessor, a digital signal processor, and processors similar thereto. The input/output device 2020 may include at least one of a keypad, a keyboard, and a display. The memory 2030 may be used for storing a command executed by the controller 2010. For example, the memory 2030 may be used for storing user data.

The electronic system 2000 may constitute a wireless communication device, or a device capable of transmitting and/or receiving information in a wireless environment. In the electronic system 2000, to transmit/receive data through a wireless communication network, the interface 2040 may be configured as a wireless interface. The interface 2040 may include an antenna and/or a wireless transceiver. In some example embodiments, the electronic system 2000 may be used for a communication interface protocol of a 3rd-generation communication system, such as code division multiple access (CDMA), global system for mobile communications (GSM), north American digital cellular (NADC), extended-time division multiple access (E-TDMA), and/or wide band code division multiple access (WCDMA). The electronic system 2000 may include at least one of integrated circuit devices fabricated by the methods according to example embodiments of the inventive concepts, for example, the integrated circuit devices 100, 200, 300 described with reference to FIGS. 1A to 21C and integrated circuit devices having various structures changed and modified therefrom without departing from the spirit and scope of the inventive concepts.

While the inventive concepts has been particularly shown and described with reference to some example embodiments thereof, it will be understood that various changes in form and details may be made therein without departing from the spirit and scope of the following claims.

What is claimed is:

1. An integrated circuit device comprising:
   a substrate having at least one fin-shaped active region, the at least one fin-shaped active region extending in a first direction;
   a gate line extending on the at least one fin-shaped active region in a second direction, the second direction intersecting with the first direction;
   a conductive region on a portion of the at least one fin-shaped active region at one side of the gate line;
   an insulating film covering the conductive region; and
   a contact plug extending through the insulating film_from the conductive region in a third direction, the third direction being perpendicular to a main plane of the substrate, the contact plug including,
      a metal plug,
      an N-rich metal nitride film on the conductive region, the N-rich metal nitride film surrounding a sidewall and a bottom surface of the metal plug, the N-rich metal nitride film contacting the insulating film around the sidewall of the metal plug, and
      a metal silicide film between the conductive region and the N-rich metal nitride film.

2. The integrated circuit device according to claim 1, wherein the N-rich metal nitride film comprises a TiN film.

3. The integrated circuit device according to claim 1, wherein the sidewall and the bottom surface of the metal plug are in physical contact with the N-rich metal nitride film.

4. The integrated circuit device according to claim 1, wherein the N-rich metal nitride film is in physical contact with the metal silicide film.

5. The integrated circuit device according to claim 1, wherein:
   the at least one fin-shaped active region comprises a fin recess, a bottom of the fin recess being at a level lower than a top surface of the at least one fin-shaped active region under the gate line; and
   the conductive region comprises a semiconductor layer epitaxially grown on the fin recess.

6. The integrated circuit device according to claim 1, further comprising:
an insulating spacer covering a sidewall of the gate line, the insulating spacer between the gate line and the insulating film.

7. The integrated circuit device according to claim 6, wherein:
the insulating film is interposed between the insulating spacer and the contact plug; and
a dielectric constant of the insulating spacer is less than a dielectric constant of the insulating film.

8. The integrated circuit device according to claim 6, wherein the insulating spacer includes SiOCN, SiCN, SiBN, SiBCN, or combinations thereof.

9. The integrated circuit device according to claim 1, wherein:
the at least one fin-shaped active region comprises a plurality of fin-shaped active regions extending parallel to each other; and
the contact plug extends on the plurality of fin-shaped active regions such that the contact plug intersects with the plurality of fin-shaped active regions.

10. The integrated circuit device according to claim 1, wherein the insulating film includes at least one film selected from among a SiOC film and a SiCOH film.

11. An integrated circuit device comprising:
a substrate having at least one active region, the at least one active region extending in a first direction;
a gate line extending on the at least one active region in a second direction, the second direction intersecting with the first direction;
a source/drain region on the at least one active region at one side of the gate line;
an insulating film covering the source/drain region;
an interlayer dielectric covering the gate line and the insulating film; and
a contact plug extending through the insulating film and the interlayer dielectric from the source/drain region in a third direction, the third direction being perpendicular to a main plane of the substrate, the contact plug including,
a metal plug,
a metal nitride film on the source/drain region, the metal nitride film surrounding a sidewall and a bottom surface of the metal plug, the metal nitride film contacting the insulating film and the interlayer dielectric around the sidewall of the metal plug, the metal nitride film having a nitrogen content greater than a nitrogen content according to a stoichiometric atomic ratio between metal and nitrogen, and
a metal silicide film between the source/drain region and the metal nitride film.

12. The integrated circuit device according to claim 11, wherein the metal nitride film includes a TiN film.

13. The integrated circuit device according to claim 11, wherein the sidewall and the bottom surface of the metal plug are in physical contact with the metal nitride film.

14. The integrated circuit device according to claim 11, wherein the metal nitride film is in physical contact with the metal silicide film.

15. The integrated circuit device according to claim 11, further comprising:
an insulating spacer covering a sidewall of the gate line, the insulating spacer between the gate line and the insulating film.

16. The integrated circuit device according to claim 15, wherein the insulating film is interposed between the insulating spacer and the contact plug, and
wherein a dielectric constant of the insulating spacer is less than a dielectric constant of the insulating film.

17. The integrated circuit device according to claim 15, wherein the insulating spacer includes SiOCN, SiCN, SiBN, SiBCN, or combinations thereof.

18. The integrated circuit device according to claim 11, wherein the source/drain region comprises an epitaxially grown semiconductor layer on the at least one active region.

19. The integrated circuit device according to claim 11, wherein
the at least one active region includes a plurality of active regions extending parallel to each other; and
the contact plug extends on the plurality of active regions such that the contact plug intersects with the plurality of active regions.

20. The integrated circuit device according to claim 11, wherein the insulating film includes at least one film selected from among a SiOC film and a SiCOH film.

* * * * *

UNITED STATES PATENT AND TRADEMARK OFFICE
CERTIFICATE OF CORRECTION

PATENT NO. : 10,079,210 B2  
APPLICATION NO. : 15/186825  
DATED : September 18, 2018  
INVENTOR(S) : Do-sun Lee et al.

Page 1 of 1

It is certified that error appears in the above-identified patent and that said Letters Patent is hereby corrected as shown below:

On the Title Page

Item (73) should read:  
(73) Assignee: Samsung Electronics Co., Ltd., Gyeonggi-do (KR)

Signed and Sealed this  
Third Day of September, 2019

Andrei Iancu  
*Director of the United States Patent and Trademark Office*